US012670822B2

(12) United States Patent
Jiang et al.

(10) Patent No.: US 12,670,822 B2
(45) Date of Patent: Jun. 30, 2026

(54) DISPLAY PANEL AND DISPLAY DEVICE

(71) Applicant: Xiamen Tianma Microelectronics Co., Ltd., Xiamen (CN)

(72) Inventors: Bin Jiang, Xiamen (CN); Min Huang, Xiamen (CN); Jiancai Huang, Xiamen (CN); Chunjin Lin, Xiamen (CN); Linqiong Cai, Xiamen (CN)

(73) Assignee: Xiamen Tianma Microelectronics Co., Ltd., Xiamen (CN)

( * ) Notice: Subject to any disclaimer, the term of this patent is extended or adjusted under 35 U.S.C. 154(b) by 0 days.

(21) Appl. No.: 18/975,063

(22) Filed: Dec. 10, 2024

(65) Prior Publication Data

US 2025/0104589 A1  Mar. 27, 2025

(30) Foreign Application Priority Data

May 11, 2024  (CN) .......................... 202410584852.3

(51) Int. Cl.
G09G 3/20  (2006.01)
G11C 19/28  (2006.01)
(52) U.S. Cl.
CPC .............. G09G 3/20 (2013.01); G11C 19/28 (2013.01); *G09G 2310/0267* (2013.01); *G09G 2310/0286* (2013.01); *G09G 2310/08* (2013.01); *G09G 2330/021* (2013.01)
(58) Field of Classification Search
CPC ............. G09G 3/20; G09G 2310/0267; G09G 2310/0286; G09G 2310/08; G09G 2330/021; G09G 5/393; G11C 19/28
See application file for complete search history.

(56) References Cited

U.S. PATENT DOCUMENTS

2014/0192039 A1* 7/2014 Wang ........................ G09G 5/18
                                                           377/64
2022/0270532 A1* 8/2022 Zong ........................ G09G 3/20

FOREIGN PATENT DOCUMENTS

| CN | 105702294 A | * | 6/2016 | ............. G11C 19/28 |
| CN | 113160738 A | * | 7/2021 | ........... G09G 3/3233 |
| CN | 115035863 A | | 9/2022 | |
| CN | 116363981 A | | 6/2023 | |
| CN | 116363982 A | | 6/2023 | |

* cited by examiner

*Primary Examiner* — Stephen G Sherman
(74) *Attorney, Agent, or Firm* — KDW FIRM PLLC

(57) ABSTRACT

In a display panel, a driver circuit includes multiple cascaded shift register units. In each display frame, each of the reset clock signal and the output control signal includes multiple effective pulses; A working mode of the display panel includes a first mode. The first mode includes at least one first display frame. The driver circuit includes a first shift register unit. In the first display frame, each of at least part of the output control signal received by the first shift register unit is a first-type output control signal. In the first shift register unit, a time interval between two adjacent effective pulses of the first-type output control signal is a first time interval, and a time interval between two adjacent effective pulses of the reset clock signal is a second time interval. The first time interval overlaps with and is greater than the second time interval.

19 Claims, 15 Drawing Sheets

P5

P7

Mode2

DISPLAY PANEL AND DISPLAY DEVICE

CROSS-REFERENCE TO RELATED APPLICATION

This application claims priority to Chinese Patent Application No. 202410584852.3, filed on May 11, 2024, the disclosure of which is incorporated herein by reference in its entirety.

TECHNICAL FIELD

The present disclosure relates to the field of display technologies, and in particularly, to a display panel and a display device.

BACKGROUND

A display panel is usually provided with multiple pixels arranged in an array, and the pixels are scanned line by line by using a shift register, so that data signals and the like can be written into the pixels line by line, and the pixels can display and emit light according to the data signals received by the pixels, thereby presenting a corresponding display image.

When the display panel displays the image, the higher the display refresh frequency of the display panel is, the shorter the pixel scan period is and thus the higher the power consumption of the display panel is. The power consumption of the display panel can be reduced effectively by reducing the refresh frequency, however, a relatively low refresh frequency may affect the display quality of some specific display images, for example, the relatively low refresh frequency may affect the display effect of images such as videos and games. Therefore, how to reduce the power consumption of the display panel without affecting the display quality of the display images becomes an urgent technical problem that needs to be solved.

SUMMARY

The present disclosure provides a display panel and a display device, to ensure display quality of a display image, simplify circuit design of the display panel, and reduce power consumption of the display panel.

According to one aspect of the present disclosure, a display panel is provided. The display panel includes a driver circuit, and the driver circuit includes multiple cascaded shift register units. A shift register unit of the multiple cascaded shift register units includes an input module, a reset module, a node mutual control module, and N output modules, where N is a positive integer; in the same shift register unit among the multiple cascaded shift register units, the input module is configured to receive at least an input signal and a scan control signal and control a signal of a first node; the reset module is configured to receive at least a reset clock signal and the scan control signal and control a signal of a second node; the node mutual control module is configured to receive at least the signal of the first node and the signal of the second node, control the signal of the second node according to the signal of the first node, and control the signal of the first node according to the signal of the second node; and an output module of the N output modules is configured to receive at least the signal of the first node, the signal of the second node, a first level signal and an output control signal and control a gate drive signal. At least one gate drive signal of an i-th-stage shift register unit among the multiple cascaded shift register units is an input signal of a j-th-stage shift register unit among the multiple cascaded shift register units, where i≠j, and i and j are each a positive integer. In each display frame of the display panel, each of the reset clock signal and the output control signal includes multiple effective pulses. A working mode of the display panel includes a first mode; the first mode includes at least one first display frame, and the driver circuit includes a first shift register unit; in the first display frame, each of at least part of the output control signal received by the first shift register unit is a first-type output control signal; in the first shift register unit, a time interval between two adjacent effective pulses of the first-type output control signal is a first time interval, and a time interval between two adjacent effective pulses of the reset clock signal is a second time interval; and the first time interval overlaps with the second time interval, and the first time interval is greater than the second time interval.

According to another aspect of the present disclosure, a display device is provided. The display device includes the above-described display panel.

It should be understood that the contents described in this section are not intended to identify key or critical features of the embodiments of the present disclosure, nor intended to limit the scope of the present disclosure. Other features of the present disclosure will be readily understood from the following description.

BRIEF DESCRIPTION OF DRAWINGS

In order to describe technical solutions in embodiments of the present disclosure more clearly, the drawings used for describing the embodiments will be briefly introduced below. Apparently, the drawings in the following description are merely some embodiments of the present disclosure. For those of ordinary skill in the art, other drawings may also be obtained without creative labor according to these drawings.

DETAILED DESCRIPTION

Figure 1:
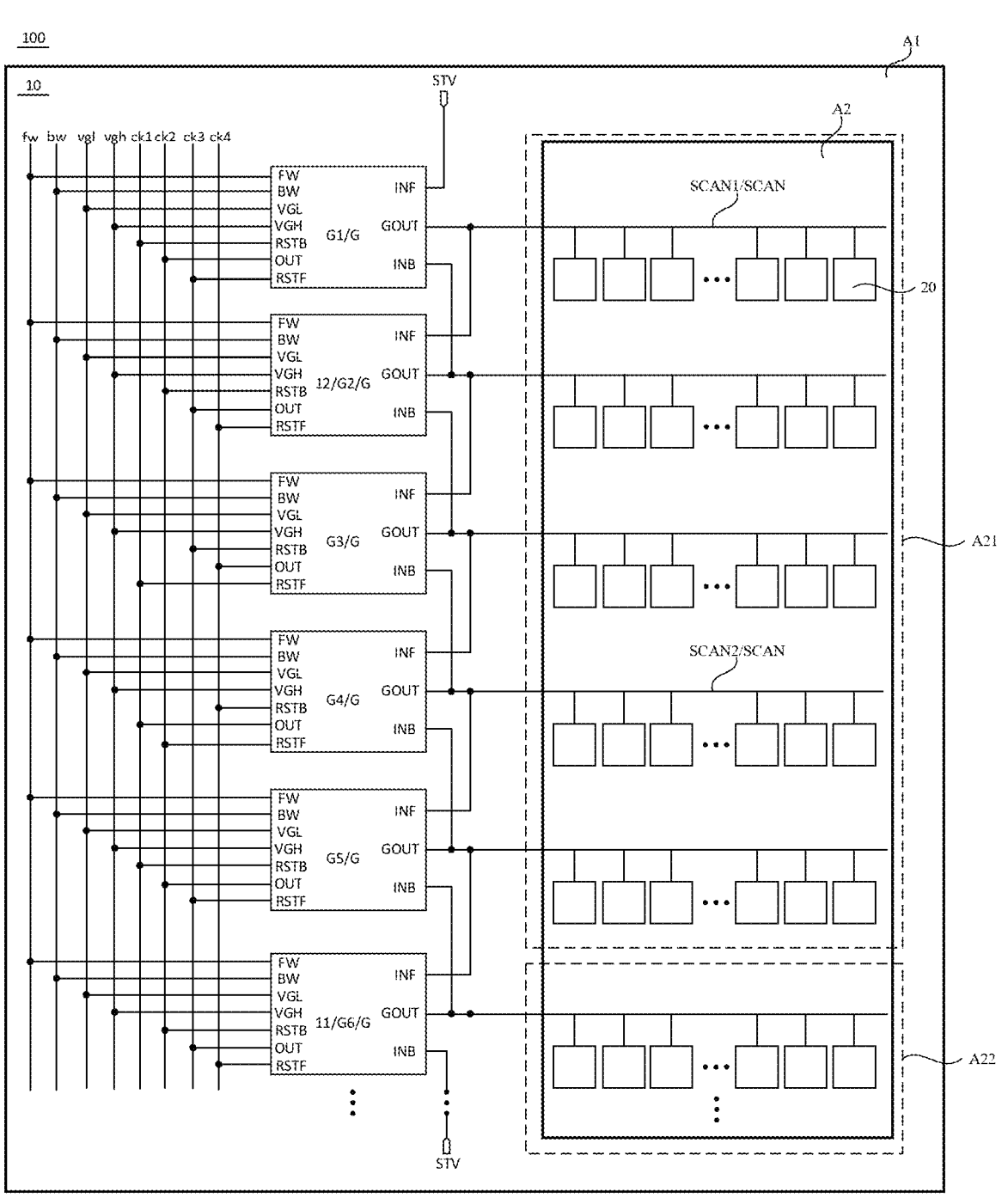
FIG. 1 is a schematic structural diagram of a display panel according to an embodiment of the present disclosure.

In order that those skilled in the art will better understand the solutions of the present disclosure, the technical solutions adopted, and the technical effects to be achieved by the present disclosure, the technical solutions of embodiments of the present disclosure will be clearly and completely described below in conjunction with the accompanying drawings of the embodiments of the present disclosure. Apparently, the described embodiments are merely some embodiments of the present disclosure, rather than all of the embodiments. All other embodiments obtained by those of ordinary skill in the art based on the embodiments of the present disclosure without needing creative efforts shall all fall in the scope of protection of the present disclosure.

It should be noted that the terms "first", "second" and the like in the description and claims of the present disclosure, and in the foregoing drawings, are used for distinguishing between similar objects and not necessarily for describing a particular order or sequential order. It should be understood that the data so used are interchangeable as appropriate so that the embodiments of the present disclosure described herein can be implemented in an order other than those illustrated or described herein. Moreover, the terms "include" and "have" as well as any variations thereof, are intended to cover a non-exclusive inclusion, for example, a process, a method, a system, a product, or a device that includes a series of steps or units is not necessarily limited to those steps or units expressly listed, but may include other steps or units not expressly listed or inherent to such process, method, product, or device.

As described in the background art, for a dynamic image with a higher requirement on the display quality of the display image, the image refresh frequency of the display panel needs to be higher, while for a static image with a lower requirement on the display quality of the display image, the image refresh frequency of the display panel may be set to be lower to reduce the power consumption of the display panel. At present, the display panel enables different display regions of the display panel to have different refresh frequencies, which is usually implemented by adding a shift register unit or changing a circuit of the shift register unit and, meanwhile, requires adding corresponding clock signals, corresponding control signals and the like, making the design of the driver circuit relatively complex and not facilitating a narrow frame design of the display panel.

To resolve the above-described technical problems, embodiments of the present disclosure provide a display panel. The display panel includes a driver circuit, and the driver circuit includes multiple cascaded shift register units. A shift register unit of the multiple cascaded shift register units includes an input module, a reset module, a node mutual control module, and N output modules, where N is a positive integer; in the same shift register unit among the multiple cascaded shift register units, the input module is configured to receive at least an input signal and a scan control signal and control a signal of a first node; the reset module is configured to receive at least a reset clock signal and the scan control signal and control a signal of a second node; the node mutual control module is configured to receive at least the signal of the first node and the signal of the second node, control the signal of the second node according to the signal of the first node, and control the signal of the first node according to the signal of the second node; and an output module of the N output modules is configured to receive at least the signal of the first node, the signal of the second node, a first level signal and an output control signal and control a gate drive signal. At least one gate drive signal of an i-th-stage shift register unit among the multiple cascaded shift register units is an input signal of a j-th-stage shift register unit among the multiple cascaded shift register units, where i≠j, and i and j are each a positive integer. In each display frame of the display panel, each of the reset clock signal and the output control signal includes multiple effective pulses. A working mode of the display panel includes a first mode; the first mode includes at least one first display frame, and the driver circuit includes a first shift register unit; in the first display frame, each of at least part of the output control signal received by the first shift register unit is a first-type output control signal; in the first shift register unit, a time interval between two adjacent effective pulses of the first-type output control signal is a first time interval, and a time interval between two adjacent effective pulses of the reset clock signal is a second time interval; and the first time interval overlaps with the second time interval, and the first time interval is greater than the second time interval.

According to the above-described technical solutions, when the display panel is in the first working mode, at least one first shift register exists in the driver circuit; in the first display frame in the first working mode, a time interval between two adjacent effective pulses of the output control signal of the first shift register is set to the first time interval, a time interval between two adjacent effective pulses in the reset clock signal that overlaps with the first time interval is set to the second time interval, and the first time interval is set to be greater than the second time interval, so that effective pulse time of the reset clock signal is before effective pulse time of the output control signal, thereby the signal of the first node is reset to be at an ineffective level before the effective pulse of the output control signal received by the first shift register unit, and the signal of the first node cannot control the output module to output the effective pulse of the output control signal as the gate drive signal. Therefore, in the first display frame of the first mode, the gate drive signal output by the output module of the first shift register unit is maintained at an ineffective level of the output control signal or to be a first level signal of the output control signal, and gate drive signals output by the cascaded shift register units after the first shift register unit are maintained at an ineffective level of the output control signal or to be a first level signal of the output control signal, thereby pixel circuits electrically connected to part of the shift registers will not perform the image refresh, and corresponding nodes in the pixel circuit will not be charged or discharged, and thus the power consumption of the display panel can be effectively reduced. In addition, the display panel is usually driven by a driver chip. In this case, the driver chip may determine the first shift register unit in the driver circuit and a time interval between the reset clock signal and the output control signal that are provided to the first shift register unit according to the display requirement of the display panel. Therefore, the cascading manner of the shift register in the driver circuit and the structure of each-stage shift register in the driver circuit do not need to be changed, and a time interval between an effective pulse of the reset clock signal and/or and an effective pulse of the output control signal is adjusted only according to the display requirement of the display panel, so that the refresh frequency of the pixel signal electrically connected to at least part of the shift registers can be implemented. Therefore, the design of the display panel is simplified while the complexity of the driver circuit is not increased, and thus the narrow frame design of the display panel is facilitated.

Figure 2:
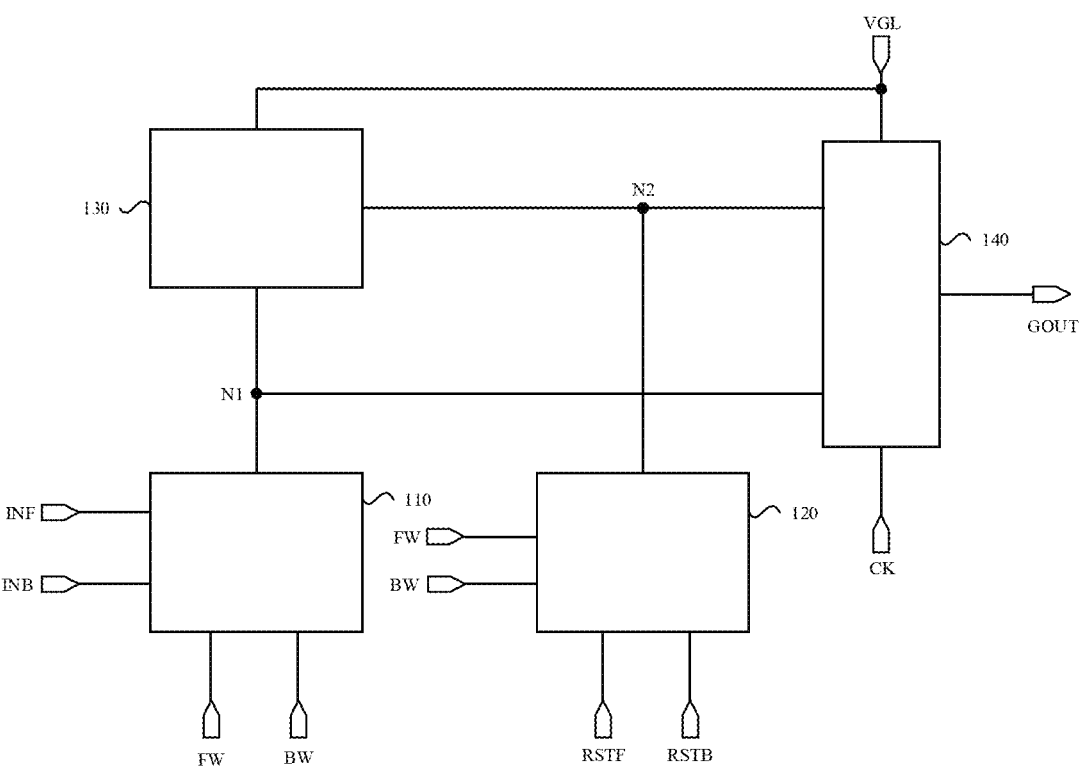
FIG. 2 is a schematic structural diagram of a shift register unit according to an embodiment of the present disclosure.
Figure 3:
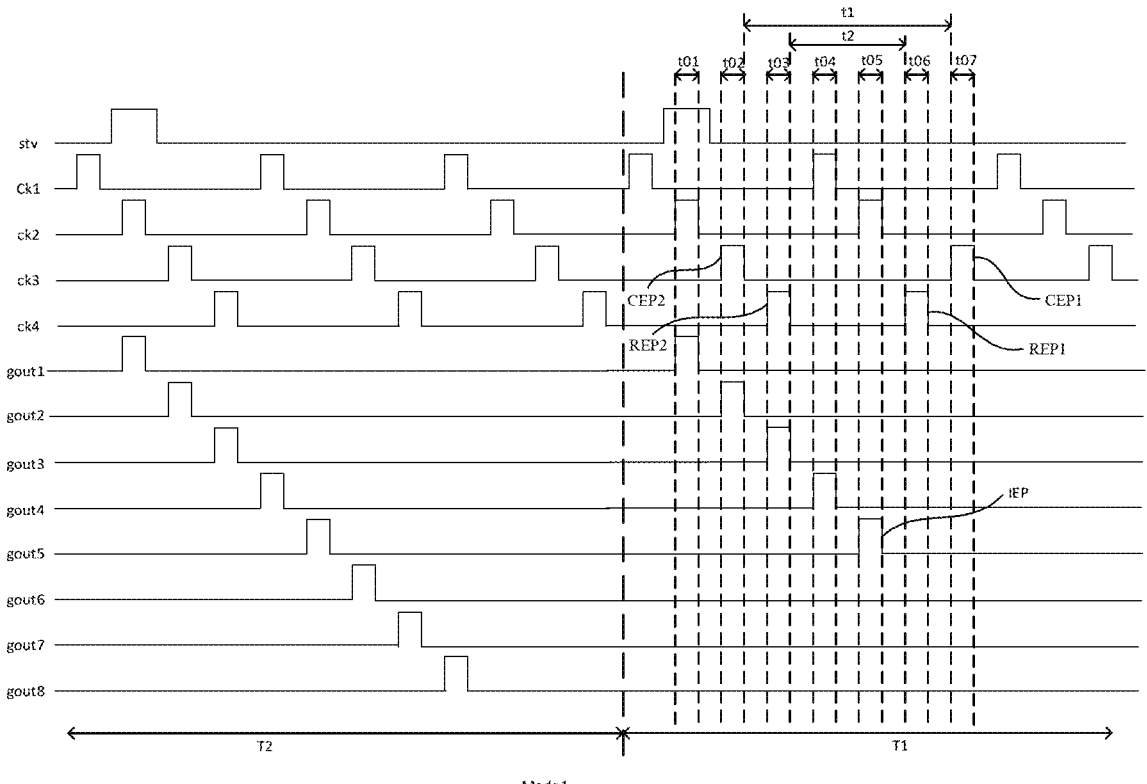
FIG. 3 is a drive timing diagram of a driver circuit according to an embodiment of the present disclosure.

FIG. 1 is a schematic structural diagram of a display panel according to an embodiment of the present disclosure, FIG. 2 is a schematic structural diagram of a shift register unit according to an embodiment of the present disclosure, and FIG. 3 is a drive timing diagram of a driver circuit according to an embodiment of the present disclosure. With reference to FIG. 1, FIG. 2 and FIG. 3, the display panel 100 includes a driver circuit 10. The driver circuit 10 includes multiple cascaded shift register units G. The shift register unit G includes an input module 110, a reset module 120, a node mutual control module 130 and N output modules 140, where N is a positive integer. In the same shift register unit G, the input module 110 is configured to receive at least an input signal inf and a scan control signal (fw and bw) and control a signal of a first node N1. The reset module 120 is configured to receive at least a reset clock signal (rstf and rstb) and the scan control signal (fw and bw) and control a signal of a second node N2. The node mutual control module 130 is configured to receive at least the signal of a first node N1 and the signal of a second node N2, control the signal of the second node N2 according to the signal of the first node N1, and control the signal of the first node N1 according to the signal of the second node N2. The output module 140 is configured to receive at least the signal of the first node N1, the signal of the second node N2, a first level signal vgl, and an output control signal out and control a gate drive signal gout. At least one gate drive signal gout of an i-th-stage shift register unit Gi is the input signal inf of a j-th-stage shift register unit Gj, where i≠j, and i and j are each a positive integer. In each display frame of the display panel 100, each of the reset clock signal rstf and the output control signal out includes multiple effective pulses. A working mode of a display panel 100 includes a first mode Mode1. The first mode Mode1 includes at least one first display frame T1, and the driver circuit 10 includes a first shift register unit 11. In the first display frame T1, each of at least part of the output control signal out received by the first shift register unit 11 is a first-type output control signal out'. In the first shift register unit 11, a time interval between two adjacent effective pulses of the first-type output control signal out' is a first time interval t1, and a time interval between two adjacent effective pulses of the reset clock signal rstf is a second time interval t2. The first time interval t1 overlaps with the second time interval t2, and the first time interval t1 is greater than the second time interval t2.

It should be noted that, the foregoing gives an exemplary description by exemplarily using an example in which the driver circuit 10 is located in a non-display region A1 and a pixel circuit 20 is located in a display region A2. In other embodiments of the present disclosure, both the pixel circuit 20 and the driver circuit 10 may be located in the display region A2, so that the number of components disposed in the non-display region A1 of the display panel 100 is sufficiently small, and the size of the non-display region A1 of the display panel 100 is reduced, thereby facilitating the narrow frame of the display panel 100 and enabling the display panel 100 to have a relatively high screen-to-body ratio.

For ease of description, without being particularly limited, in the embodiments of the present disclosure, the technical solutions in the embodiments of the present disclosure are described exemplarily by using an example in which the driver circuit 10 is located in the non-display region A1 of the display panel 100 and the pixel circuit 20 is located in the display region A2 of the display panel 100.

Each shift register unit G may include one output module 140, or may include multiple output modules 140. In addition, the number of output modules 140 in each shift register unit G may be the same or different. In the following embodiments, the technical solutions of the present disclosure are described exemplarily by using an example in which each shift register unit G includes one output module 140. Moreover, in a case where no special description is provided, the number of output modules 140 in each shift register unit G in the present disclosure is the same.

A gate drive signal gouti of the i-th-stage shift register unit Gi is an input signal (inf or inb) of the j-th-stage shift register unit Gj. In this way, the gate drive signal gouti of the i-th-stage shift register unit Gi can control a working process of the j-th-stage shift register unit Gj in order to control a gate drive signal goutj of the j-th-stage shift register unit Gj.

When the shift register unit G includes one output module 140, that is, when N is equal to 1, the i-th-stage shift register unit Gi and the j-th-stage shift register unit Gj may be set to be adjacent two-stage shift register units G and may be set to be connected to two adjacent rows of pixel circuits 20, separately. In this case, when image refresh frequencies of display regions in the display panel 100 are the same, multiple stages of shift register units G may output gate drive signals gout with sequentially shifted effective pulses, to implement the progressive scanning of the pixel circuits 20. In other feasible embodiments, the i-th-stage shift register unit Gi and the j-th-stage shift register unit Gj may also be disposed to be two non-adjacent shift register units. In a case where no special description is provided, in the present disclosure, the i-th-stage shift register unit Gi and the j-th-stage shift register unit Gj are optionally disposed to be adjacent two-stage shift register units and are optionally disposed to be connected to two adjacent rows of pixel circuits 20, separately.

The shift register unit G may include two input terminals (INF and inb), and the two input terminals are configured to receive the input signal inf and the input signal inb, separately. Each shift register unit G may include two scan control terminals (FW and BW), and the two scan control terminals are configured to receive the scan control signal fw and the scan control signal bw, separately. Each shift register unit G further includes two reset clock signal terminals (RSTF and RSTB), and the two reset clock signal terminals are configured to receive the reset clock signal rstf and the reset clock signal rstb, separately. When the driver circuit 10 is in a forward scanning stage, the scan control signal fw may be set to be at an effective level, and the scan control signal bw may be set to be at an ineffective level, therefore, multiple stages of shift register units G enable effective pulses of gate drive signals gout output by the multiple stages of shift register units G to be sequentially shifted in a forward direction (such as, sequentially shifted from top to bottom) in response to at least the input signal inf, the scan control signal fw and the reset clock signal rstf, to implement the progressive scanning of the pixel circuit 20 from top to bottom. When the driver circuit 10 is in a reverse scanning stage, the scan control signal fw may be set to be at an ineffective level, and the scan control signal bw is set to be at an effective level; therefore, multiple stages of shift register units G enable effective pulses of gate drive signals gout output by the multiple stages of shift register units G to be sequentially shifted in a reverse direction (such as, sequentially shifted from bottom to top) in response to at least the input signal inf, the scan control signal fw and the reset clock signal rstf, to implement the progressive scanning of the pixel circuit 20 from bottom to top. The effective pulse includes the effective level, and the ineffective pulse includes the ineffective level.

It is to be understood that an input terminal INF of a first-stage shift register unit G1 and an input terminal INB of an N-th-stage shift register unit Gn are electrically connected to a start signal output terminal STV which is used for providing a start signal stf and located in a start control circuit (not shown in the drawings). In the forward scanning stage, the start control circuit (not shown in the drawings) may provide a start signal stv including the effective pulse to the first-stage shift register unit G1, where the start signal stv is used as an input signal inf of the first-stage shift register unit G1, so that the first-stage shift register unit G1 outputs a first-stage gate drive signal gout1 in response to at least the start signal stv and the scan control signal fw. In the reverse scanning stage, the start control circuit (not shown in the drawings) may provide a start signal stv including the effective pulse to the N-th-stage shift register unit Gn, where the start signal stv is used as an input signal inb of the N-th-stage shift register unit Gn, so that the N-th-stage shift register unit Gn outputs the N-th-stage gate drive signal goutn in response to at least the start signal stv and the scan control signal bw. For other shift register units G, an input terminal INF of the i-th-stage shift register unit Gi is set to be electrically connected to a gate drive signal output terminal GOUT of an (i−1)-th-stage shift register unit Gi−1, and an input terminal inb of the i-th-stage shift register unit Gi is set to be electrically connected to a gate drive signal output terminal GOUT of an (i+1)-th-stage shift register unit Gi+1, that is, an input signal inf of the i-th-stage shift register unit Gi is the gate drive signal gouti−1 of the (i−1)-th-stage shift register unit Gi−1, and an input signal inb of the i-th-stage shift register unit Gi is a gate drive signal gouti+1 of the (i+1)-th-stage shift register unit Gi+1. For ease of description, the technical solutions in the embodiments of the present disclosure are described exemplarily by using the forward scanning stage of the driver circuit 20 as an example in the following embodiment.

In the same shift register unit G, the input module 110 and the node mutual control module 130 are electrically connected to the first node N1, the node mutual control module 130 and the reset module 120 are electrically connected to the second node N2, and the output module 140 is electrically connected to the first node N1 and the second node, separately. The input module 110 may provide a corresponding signal to the first node N1 according to the input signal inf and the scan control signal fw that are received by the input module 110. For example, when the input signal inf is at the effective level, the input module 110 may control the first node N1 to be at the effective level according to the input signal inf and the scan control signal fw that are received by the input module 110.

The reset module 120 may provide a corresponding signal to the second node N2 according to the reset clock signal rstf and the scan control signal fw that are received by the reset module 120. For example, when the reset clock signal rstf is at the effective level, the reset module 120 may control the second node N2 to be at the effective level according to the reset clock signal rstf and the scan control signal fw. When the reset clock signal rstf is at the ineffective level, the reset module 120 may control the second node N2 to be at the ineffective level according to the reset clock signal rstf and the scan control signal fw.

Correspondingly, in the same shift register unit G, the node mutual control module 130 may control the signal of the second node N2 according to the signal of the first node N1 received by the node mutual control module 130, and control the signal of the first node N1 according to the signal of the second node N2 received by the node mutual control module 130. For example, when the signal of the first node N1 is at the effective level, the node mutual control module 130 may control the signal of the second node N2 to be at the ineffective level. When the signal of the second node N2 is at the effective level, the node mutual control module 130 may control the signal of the first node N1 to be at the ineffective level.

The output module 140 may receive at least the signal of the first node N1, the signal of the second node N2, the first level signal vgl and the output control signal out and control the gate drive signal gout. For example, when the signal of the first node N1 is at the effective level, the output module 140 may output the output control signal out to a corresponding pixel circuit 20, and use the output control signal out as the gate drive signal gout. When the signal of the second node N2 is at the effective level, the output module 140 may output the first level signal vgl to the corresponding pixel circuit 20, and use the first level signal vgl as the gate drive signal gout.

In the embodiments of the present disclosure, the first level signal vgl is optionally set to be at the ineffective level, when the first node N1 is at the effective level, the output module 140 outputs the output control signal out as the gate drive signal gout. If it is desired to make the output gate drive signal gout be the effective pulse, a fact that the output control signal out includes the effective level during a time period in which the signal of the first node N1 is maintained at the effective level needs to be at least ensured. After the signal of the first node N1 is reset to at the ineffective level, the output module 140 cannot output the output control signal out as the gate drive signal gout. In this way, when the signal of the first node N1 needs to be reset, the reset clock signal rstf may be set to at the effective level, so that the reset module 120 controls the signal of the second node N2 to be at the effective level according to the effective level of the scan control signal fw and the effective level of the reset clock signal rstf to the effective level, and the node mutual control module 130 controls the signal of the first node N1 to be at the ineffective level according to the signal of the second node N2, that is, the effective pulse of the reset clock signal rstf needs to be located after the effective pulse of the output control signal out, and thus it is ensured that the output module 140 can output the effective level of the gate drive signal gout.

The reset clock signal rstf, the output control signal out, the scan control signal fw, and the gate drive signal gout may all be pulse signals composed of a high level and a low level, one of the high level or the low level is the effective level, and the other of the high level or the low level is the ineffective level. Referring to FIG. 3, in one display frame of the display panel, multiple stages of shift register units G sequentially output the effective level of the gate drive signal gout, and in this stage, the reset clock signal rstf and the output control signal out each include multiple effective pulses, so that after each shift register unit G receives the effective level of the input signal inf, each-stage shift register unit G may output a corresponding gate drive signal gout according to the jumping condition of the reset clock signal rstf and the output control signal out.

Correspondingly, the display panel 100 may include a first working mode Mode1. In the first working mode Mode1, the display panel 100 may have two sub-display regions with different refresh frequencies, for example, a first sub-display region A21 with a higher refresh frequency and a second sub-display region A22 with a lower refresh frequency, that is, frequencies of gate drive signals gout output by at least part of the shift register units G in the driver circuit 10 are different. The first working mode Mode1 includes at least one first display frame T1. In the first display frame T1, only a signal of pixel circuits in the first sub-display region A21 that has a relatively high refresh frequency may be refreshed, and a signal of pixel circuits in the second sub-display region A22 that has a relatively low refresh frequency remains unchanged.

In some embodiments, the display panel 100 includes a display region A2. Multiple gate drive lines SCAN are disposed in the display region A2. Multiple stages of shift register units G are correspondingly electrically connected to gate drive lines SCAN, separately. In the first mode Mode1, the display region A2 includes a first sub-display region A21 and a second sub-display region A22. In the first display frame T1, a gate drive line SCAN located in the first sub-display region A21 is a first gate drive line SCAN1, and a gate drive line SCAN located in the second sub-display region A22 is a second gate drive line SCAN2. Effective pulse time of gate drive signals gout transmitted by the first gate drive line SCAN1 is shifted sequentially, and gate drive signal gouts transmitted by the second gate drive line SCAN2 are at the ineffective level.

In the driver circuit 10, multiple stages of shift register units G are correspondingly electrically connected to gate drive lines SCAN, separately, and each-stage shift register unit G electrically connected to second gate drive lines SCAN2 located in the second display region A2 may be the first shift register unit 11, or a shift register unit G electrically connected to the second gate drive line SCAN2 located in the second display region A22 and closest to the first display region A21 is the first shift register unit 11. A sixth-stage shift register unit G6 is exemplarily shown as the first shift register unit 11 as shown in FIG. 1. For the first shift register unit 11 including one output module 140, an output control signal out received by the first shift register unit 11 is the first-type output control signal out'. For the first shift register unit 11 including the multiple output modules 140, each output module 140 correspondingly receives one output control signal out, that is, the first shift register unit 11 needs to receive multiple output control signals. In this case, each of at least part of the output control signal received by the first shift register unit 11 is the first-type output control signal out', that is, the first shift register unit 11 being including two output modules 140 is used as an example, and one output control signal of two output control signals received by the first shift register unit 11 is the first-type output control signal, or two output control signals received by the first shift register unit 11 are the first-type output control signal, which may be set according to practical requirements and is not specifically limited in the embodiments of the present disclosure.

That the shift register unit G electrically connected to the second gate drive line SCAN2 which is located in the second display region A22 and is closest to the first display region A21 is the first shift register unit 11, and the first shift register unit 11 includes one output module 140 is used as an example. In the first display frame T1, the first-type output control signal out' received by the first shift register unit 11 has two adjacent effective pulses whose time interval is the first time interval t1, and the reset clock signal rstf received by the first shift register unit 11 has two adjacent effective pulses whose time interval is the second time interval t2. The first time interval t1 may overlap with the second time interval t2. In this case, in order to make the signal of each pixel circuit in the second sub-display region A22 remain unchanged, the first time interval t1 may be set to be greater than the second time interval t2. In this way, in the first shift register unit, the second time interval t2 is shorter, and the reset clock signal rstf may become the effective pulse before the effective pulse of the first-type output control signal out', so that the reset module 120 firstly controls the second node N2 to be the effective level according to the scan control signal fw and the effective pulse of the reset clock signal rstf, and the node control module 120 controls the first node N1 to be at the ineffective level, that is, the first node N1 jumps to the ineffective level before the effective pulse of the first-type output control signal out'. When the first-type output control signal out' is the effective pulse, the output module 140 uses the effective pulse of the first-type output control signal out' as the gate drive signal gout, so that the drive signal gout output by the first shift register unit 11 is at the ineffective level. When the first shift register unit 11 is the i-th-stage shift register unit Gi, since the input signal of the j-th-stage shift register unit Gj is the gate drive signal gout output by the first shift register unit 11, so that the j-th-stage shift register unit Gj cannot receive the input signal including the effective pulse, the signal of the first node N1 in the j-th-stage shift register unit Gj is always maintained at the ineffective level, the output module 140 of the j-th-stage shift register unit Gj cannot output the output control signal received by the j-th-stage shift register unit Gj, and the gate drive signal output by the j-th-stage shift register unit Gj may be maintained at the ineffective level continuously. Moreover, since shift register units are sequentially cascaded, so that when other stages of shift register units G after the j-th-stage shift register unit Gj also

| cannot receive the input signal including the effective pulse. When the gate control signals gout output by other stages of shift register units G after the j-th-stage shift register unit Gj are all at the ineffective level, so that in the first display frame T1, signals of pixel circuits in the second sub-display region A22 cannot be refreshed, that is, a image presented by the second sub-display region A22 remains unchanged, and thus corresponding nodes in the pixel circuits 20 in the second sub-display region A22 cannot be charged and discharged, and further the power consumption of the display panel 100 can be reduced. In addition, a time interval of effective pulses of the reset clock signal rstf and/or the output control signal out received by the first shift register unit is adjusted without changing the cascading manner of the shift register unit G in the driver circuit 10 and the structure of each-stage shift register unit G, so that the display requirement of the display panel 100 can be satisfied, that is, refresh frequencies of part of pixel circuits 20 in the display panel 100 can be reduced, the design of the display panel 100 can be simplified without increasing the complexity of the driver circuit 10, and the narrow frame design of the display panel 100 can be facilitated.

According to the display panel provided in the embodiments of the present disclosure, when the display panel is in the first working mode, at least one first shift register exists in the driver circuit; in the first display frame in the first working mode, a time interval between two adjacent effective pulses of the output control signal of the first shift register is set to the first time interval, a time interval between two adjacent effective pulses in the reset clock signal that overlaps with the first time interval is set to the second time interval, and the first time interval is set to be greater than the second time interval, so that effective pulse time of the reset clock signal is before effective pulse time of the output control signal, thereby the signal of the first node is reset to be at an ineffective level before the effective pulse of the output control signal received by the first shift register unit, and the signal of the first node cannot control the output module to output the effective pulse of the output control signal as the gate drive signal. Therefore, in the first display frame of the first mode, the gate drive signal output by the output module of the first shift register unit is maintained at an ineffective level of the output control signal or to be a first level signal of the output control signal, and gate drive signals output by the cascaded shift register units after the first shift register unit are maintained at an ineffective level of the output control signal or to be a first level signal of the output control signal, thereby pixel circuits electrically connected to part of the shift registers will not perform the image refresh, and corresponding nodes in the pixel circuit will not be charged or discharged, and thus the power consumption of the display panel can be effectively reduced. In addition, the display panel is usually driven by a driver chip. In this case, the driver chip may determine the first shift register unit in the driver circuit and a time interval between the reset clock signal and the output control signal that are provided to the first shift register unit according to the display requirement of the display panel. Therefore, the cascading manner of the shift register in the driver circuit and the structure of each-stage shift register in the driver circuit do not need to be changed, and a time interval between an effective pulse of the reset clock signal and/or and an effective pulse of the output control signal is adjusted only according to the display requirement of the display panel, so that the refresh frequency of the pixel signal electrically connected to at least part of the shift registers can be implemented. Therefore, the design of the display panel is simplified while the complexity of the driver circuit is not increased, and thus the narrow frame design of the display panel is facilitated.

In an embodiment, referring to FIG. 1, FIG. 2 and FIG. 3, in the first mode Mode1, each of part of display frames is a second display frame T2. In the second display frame T2, effective pulse time of the gate drive signals gout transmitted by the first gate drive lines SCAN1 and the second gate drive lines SCAN2 is shifted sequentially.

In an embodiment, the second display frame T2 may be a display frame in which a refresh frequency of the pixel circuit of the first sub-display region A21 is the same as a refresh frequency of the pixel circuit of the second sub-display region A22, that is, in the second display frame T2 of the first mode Mode1, multiple stages of shift register units G sequentially outputs effective pulses of the gate drive signal gout, to implement the line-by-line scanning on each row of pixel circuits 20 in the display region A, so that signals in the each row of pixel circuits 20 can be refreshed, and the display light-emitting brightness of part of pixel circuits having a lower refresh frequency is prevented from being influenced since a signal in this part of pixel circuits having the lower refresh frequency from being not refreshed for a long time. In this way, in the first mode Mode1, the second display frame T2 for overall refreshing a image presented by the display region A is added, so that the display quality of the display image can be improved on the premise of reducing the power consumption.

It is to be understood that, in the display panel provided in the embodiments of the present disclosure, a cascading manner of multiple stages of shift register units in the driver circuit and a structure of each-stage shift register unit may be set according to practical requirements, which is not specifically limited in the embodiments of the present disclosure. The following uses a typical example to exemplarily describe the structure of the shift register unit mentioned in the embodiments of the present disclosure.

Figure 4:
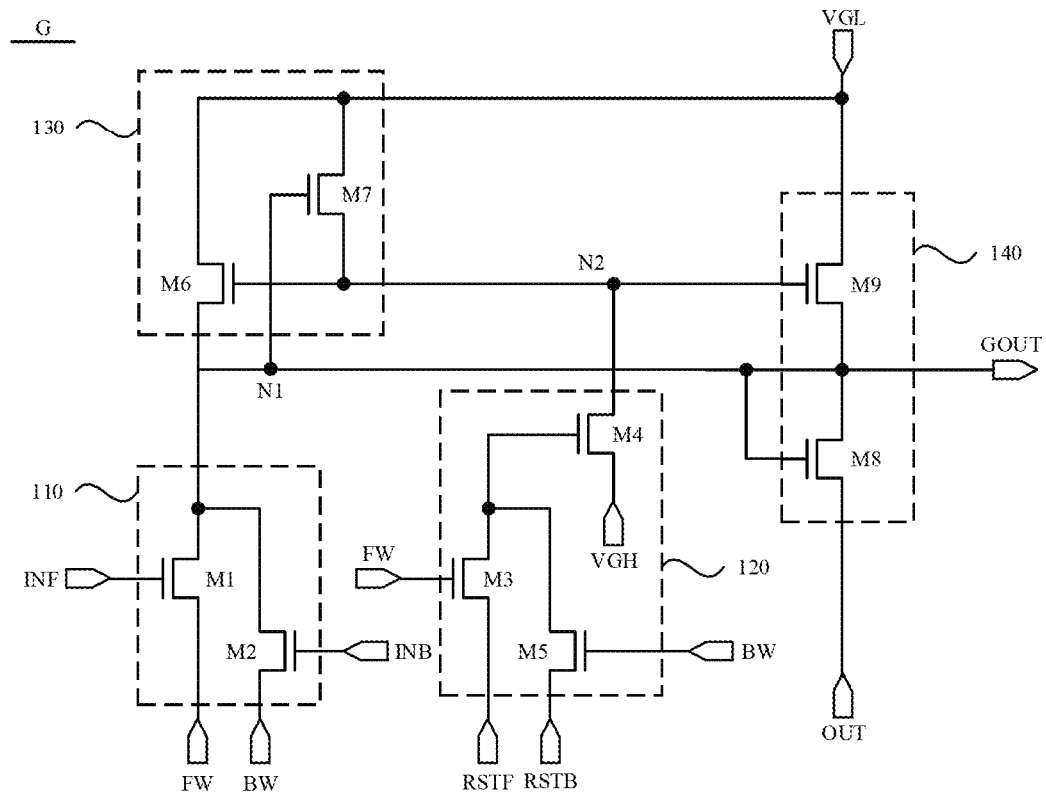
FIG. 4 is a schematic structural diagram of another shift register unit according to an embodiment of the present disclosure.

In an embodiment, FIG. 4 is a schematic structural diagram of another shift register unit according to an embodiment of the present disclosure. Referring to FIG. 4, the driver circuit being simultaneously performing a forward scanning and a reverse scanning is used as an example. In this case, the scan control terminal of the shift register unit may include a forward scan control terminal FW and a reverse scan control terminal BW, and the input terminal of the shift register unit may include a forward input terminal INF and a reverse input terminal INB. Correspondingly, the input module 110 may include a first input transistor M1 and a second input transistor M2. A first electrode of the first input transistor M1 is electrically connected to the forward scan control terminal FW, to receive a forward scan control signal fw provided by the forward scan control terminal FW. A gate of the first transistor M1 is electrically connected to the forward input terminal INF, to receive a forward input signal inf provided by the forward input terminal INF. A second electrode of the first transistor M1 is electrically connected to the first node N1. A first electrode of the second input transistor M2 is electrically connected to the reverse scan control terminal BW, to receive a reverse scan control signal bw of the reverse scan control terminal BW. A gate of the second transistor M2 is electrically connected to the reverse input terminal INB, to receive a reverse input signal inb of the reverse input terminal INB. A second electrode of the second transistor M2 is electrically connected to the first node N1. The forward input signal inf can control the first transistor M1 to be on or off, and the reverse input signal inb can control the second transistor M2 to be on or off. When the input signal inf is at the effective level, the first transistor M1 is on, and the first transistor M1 can transmit the forward scan control signal fw to the first node N1, so that the signal of the first node N1 can be consistent with the forward scan control signal fw. When the reverse input signal inb is at the effective level, the second transistor M2 is on, and the second transistor M2 can transmit the reverse scan control signal bw to the first node N1, so that the signal of the first node N1 can be consistent with the reverse scan control signal bw. In this way, when the driver circuit performs the forward scanning, the forward scan control signal fw may be controlled to be at the effective level, so that the signal of the first node N1 can be controlled by the forward input signal inf. When the driver circuit performs the reverse scanning, the reverse scan control signal bw may be controlled to be at the effective level, so that the signal of the first node N1 can be controlled by the reverse input signal inb.

In an embodiment, when the driver circuit may simultaneously perform the forward scanning and the reverse scanning, the reset clock signal terminal may include a forward reset clock signal terminal RSTF and a reverse reset clock signal terminal RSTB. The reset module 120 may include a first reset transistor M3, a second reset transistor M4 and a third reset transistor M5. A first electrode of the first reset transistor M3 is electrically connected to the forward reset clock signal terminal RSTF, to receive a forward reset clock signal rstf of the forward reset clock signal terminal RSTF. A gate of the first reset transistor M3 is electrically connected to the forward scan control terminal FW, to receive a forward scan control signal fw of the forward scan control terminal FW. A second electrode of the first reset transistor M3 is electrically connected to a gate of the second reset transistor M4. A first electrode of the second reset transistor M4 is electrically connected to the second level signal terminal VGH, to receive the second level signal vgh of the second level signal terminal VGH. A second electrode of the second reset transistor M4 is electrically connected to the second node N2. A first electrode of the third reset transistor M5 is electrically connected to the reverse reset clock signal terminal RSTB, to receive a reverse reset clock signal rstb of the reverse reset clock signal terminal RSTB. A gate of the third reset transistor M5 is electrically connected to the reverse scan control terminal BW, to receive a reverse scan control signal bw of the reverse scan control terminal BW. A second electrode of the third reset transistor M5 is electrically connected to the gate of the second reset transistor M4. The forward scan control signal fw of the forward scan control terminal FW may control the first reset transistor M3 to be on or off, and the reverse scan control signal bw of the reverse scan control terminal BW may control the third reset transistor M5 to be on or off.

In an embodiment, when the forward scan control signal fw is at the effective level, the first reset transistor M3 is on, and the first reset transistor M3 can transmit the forward reset clock signal rstf to the gate of the second reset transistor M4. If the forward reset clock signal rstf is at the effective level in this case, the second reset transistor M4 can be controlled to be on, so that the second reset transistor M4 can transmit the second level signal vgh to the second node N2, and the signal of the second node N2 can be kept to be consistent with the second level signal vgh. Similarly, when the reverse scan control signal bw is at the effective level, the third reset transistor M5 is on, and the third reset transistor M5 can transmit the reverse reset clock signal rstb to the gate of the second reset transistor M4. If the reverse reset clock signal rstb is at the effective level in this case, the second reset transistor M4 can be on, and the second level signal vgh can be transmitted to the second node N2 through the second reset transistor M4, so that the signal of the second node N2 can be controlled to be kept to be consistent with the second level signal vgh. In this way, when the driver circuit performs the forward scanning, the forward scan control signal fw may be controlled to be at the effective level, so that the signal of the second node N2 can be controlled by the forward reset clock signal rstf. When the driver circuit performs the reverse scanning, the reverse scan control signal bw may be controlled to at the effective level, so that the signal of the second node N2 can be controlled by the reverse reset clock signal rstb.

In an embodiment, the node mutual control module 130 may include a first mutual control transistor M6 and a second mutual control transistor M7. In the same shift register unit G, a first electrode of the first mutual control transistor M6 is electrically connected to a first level signal terminal VGL, to receive a first level signal vgl of the first level signal terminal VGL. A second electrode of the first mutual control transistor M6 is electrically connected to the first node N1. A gate of the first mutual control transistor M6 is electrically connected to the second node N2. A first electrode of the second mutual control transistor M7 is electrically connected to the first level signal terminal VGL, to receive the first level signal vgl of the first level signal terminal VGL. A second electrode of the second mutual control transistor M7 is electrically connected to the second node N2. A gate of the second control transistor M7 is electrically connected to the first node N1. The signal of the first node N1 can control the second commutation transistor M7 to be on or off, and the signal of the second node N2 can control the first commutation transistor M6 to be on or off.

In an embodiment, when the signal of the second node N2 is at the effective level, the first control transistor M6 is on, and the first control transistor M6 can transmit the first level signal vgl to the first node N1, so that the signal of the first node N1 is kept to be consistent with the first level signal vgl, that is, the signal of the first node N1 is at the ineffective level. When the signal of the first node N1 is at the effective level, the second control transistor M7 is on, and the second control transistor M7 can transmit the first level signal vgl to the second node N2, so that the signal of the second node N2 is kept to ve consistent with the first level signal vgl, that is, the signal of the second node N2 is at the ineffective level. In this way, the first mutual control transistor M6 and the second mutual control transistor M7 are disposed in the node mutual control module 130, so that the signal of the first node N1 and the signal of the second node N2 are mutually restricted, to prevent a condition that the signal of the first node N1 and the signal of the second node N1 are simultaneously at the effective level.

In an embodiment, the output module 140 includes a first output transistor M8 and a second output transistor M9. A first electrode of the first output transistor M8 is electrically connected to the output control signal terminal OUT, to receive an output control signal out of the output control signal terminal OUT. A gate of the first output transistor M8 is electrically connected to the first node N1. A second electrode of the first output transistor M8 is electrically connected to the gate drive signal terminal GOUT, to output the gate drive signal gout. A first electrode of the second output transistor M9 is electrically connected to the first level signal terminal VGL, to receive the first level signal vgl of the first level signal terminal VGL. A gate of the second output transistor M9 is electrically connected to the second node N2. A second electrode of the second output transistor M9 is electrically connected to the gate drive signal terminal GOUT, to output the gate drive signal gout. The first output transistor M8 may be on or off under the control of the signal of the first node N1, and when the first node N1 is at the effective level, the first output transistor M8 is turned on, and the first output transistor M8 outputs the output control signal out as the gate drive signal gout. The second output transistor M9 may be on or off under the control of the signal of the second node N2, and when the second node N2 is at the effective level, the second output transistor M9 is turned on, and the second output transistor M9 outputs the first level signal vgl as the gate drive signal gout.

Figure 5:
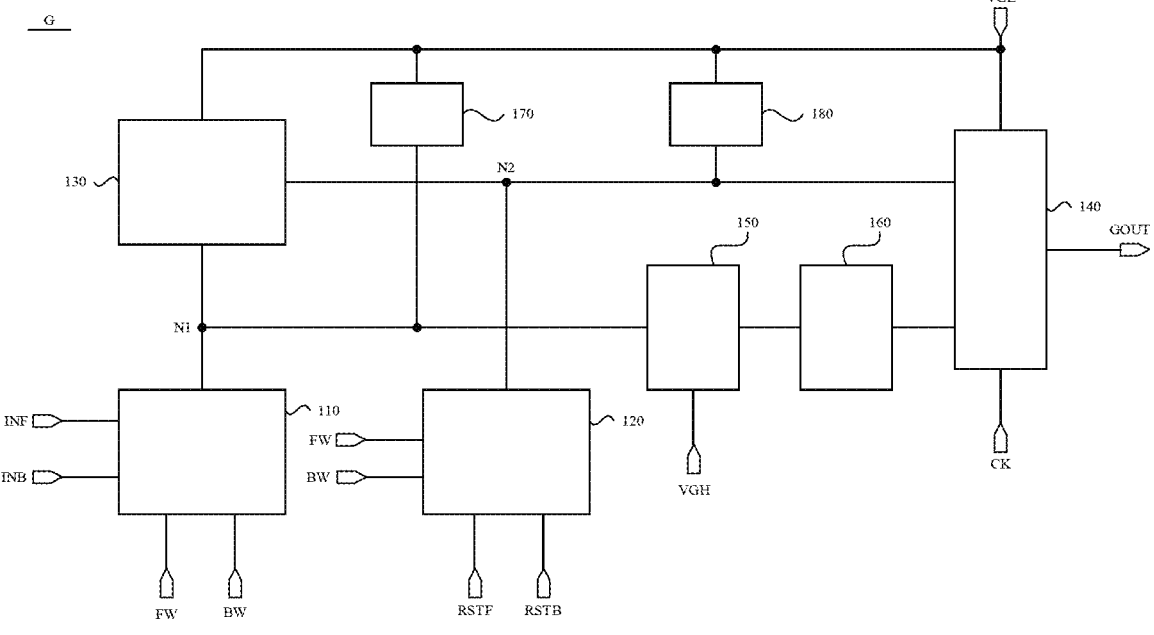
FIG. 5 is a schematic structural diagram of still another shift register unit according to an embodiment of the present disclosure.

On the basis of the above-described embodiments, in an embodiment, FIG. 5 is a schematic structural diagram of still another shift register unit according to an embodiment of the present disclosure. Referring to FIG. 5, the shift register unit G may further include a voltage regulation module 150. In the same shift register unit, the voltage regulation module 150 may be electrically connected to the first node N1 and the third node N3, separately, to stabilize the signal of the first node N1 and a signal of the third node N3. When both the signal of the first node N1 and the signal of the second node N3 are within a specified range, the voltage regulation module 150 may be in an on state, and the signal of the first node N1 may be transmitted to the third node N3 through the voltage regulation module 150. In this case, the output module 140 may be electrically connected to the first node N1 through the voltage regulation module 150, so that the output module 140 may receive the signal of the third node N3 that is the same as the signal of the first node N1. However, when a voltage of the signal of the third node N3 and/or a voltage of the signal of the first node N1 are too high or too low, the voltage regulation module 150 may be in an off state, to prevent the signal of the first node N1 from affecting the signal of the third node N3 or the signal of the third node N3 from affecting the signal of the first node N1. In this way, the voltage regulation module 150 is disposed in the shift register unit G, so that the first node N1 can be isolated from the third node N3, and the signal of the first node N1 and the signal of the third node N3 are ensured to be relatively stable, to prevent the accuracy of the gate drive signal gout output by the drive output module 140 from being influenced by the fluctuation of the signal of the first node N1 and/or the fluctuation of the signal of the third node N3, which is favorable for improving the working stability of the shift register unit G and further favorable for improving the display effect of the display panel.

Figure 6:
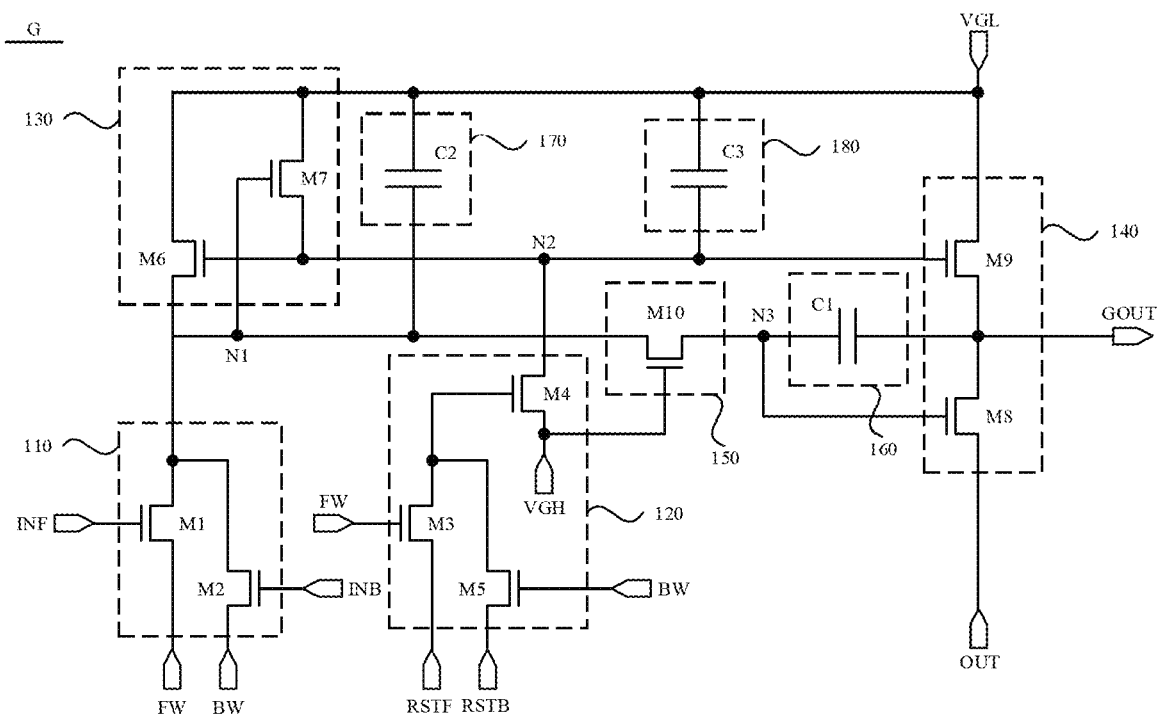
FIG. 6 is a schematic structural diagram of still another shift register unit according to an embodiment of the present disclosure.

In an embodiment, FIG. 6 is a schematic structural diagram of still another shift register unit according to an embodiment of the present disclosure. Referring to FIG. 6, the voltage regulation module 150 includes a voltage regulation transistor M10. A first electrode of the voltage regulation transistor M10 is electrically connected to the first node N1. A second electrode of the voltage regulation transistor M10 is electrically connected to the gate of the first output transistor M8 at the third node N3, and a gate of the voltage regulation transistor M10 is configured to receive the second level signal vgh. In this way, the voltage regulation transistor M10 may be kept in the on state under the control of the second level signal vgh, so that the signal of the first node N1 is transmitted to the third node N3 after performing a voltage regulation by the voltage regulation transistor M10, to control a signal of the gate of the first output transistor M8 electrically connected to the third node N3, thereby the signal of the first node N1 is kept to be basically consistent with the signal of the third node N3. In addition, since the voltage regulation transistor M10 in the on state has a certain resistance, when the signal of the third node N3 electrically connected to a drive-out module 140 changes, the voltage regulation transistor M10 can reduce a change amount of the signal of the first node N1 changing with the signal of the third node N3. Similarly, when the signal of the first node N1 changes, the voltage regulation transistor M10 can also reduce a change amount of the signal of the third node N3 that changing with the signal of the first node N1. In this way, the voltage regulation transistor M10 is disposed between the first node N1 and the third node N3, so that the stability of the signal at the first node N1 and the signal at the third node N3 can be ensured, thereby improving the stability of the gate drive signal gout output by the drive output module 140.

In an embodiment, with continued reference to FIG. 5, the shift register unit G may further include a bootstrap module 160. The bootstrap module 160 may be electrically connected between the third node N3 and the gate drive signal terminal GOUT. The bootstrap module 160 can control the signal of the third node N3 to change with the change of the gate drive signal gout of the gate drive signal terminal GOUT, so that when the gate drive signal gout changes from the ineffective level to the effective level, the signal of the third node N3 can be changed accordingly, thereby the signal of the third node N3 can control the on degree of the output module 140, the output module 140 can accurately and quickly pull the gate drive signal gout up to the effective level, thereby facilitating improvement of the accuracy and the stability of the gate drive signal gout output by the shift register unit G.

In an embodiment, with continued reference to FIG. 6, the bootstrap module 160 may include a first capacitor C1. A first plate of the first capacitor C1 is electrically connected to the third node N3. A second plate of the first capacitor C1 is electrically connected to the gate drive signal terminal GOUT. In this way, since a coupling action of the first capacitor C1, the signal of the third node N3 changes with the change of the gate drive signal gout of the gate drive signal terminal GOUT.

In an embodiment, with continued reference to FIG. 5, the shift register unit G may further include a first retention module 170. One end of the first retention module 170 is configured to receive the first level signal vgl, another end of the first retention module 170 is electrically connected to the first node N1, and the first retention module 170 can maintain the stability of the signal of the first node N1.

In an embodiment, with continued reference to FIG. 6, the first retention module 170 may include a second capacitor C2, and the second capacitor C2 serving as an energy storage capacitor can store the signal of the first node N1, to maintain the stability of the first node N1.

In an embodiment, with continued reference to FIG. 5, the shift register unit G may further include a second retention module 180. One end of the second retention module 180 is configured to receive the first level signal vgl, the other end of the second retention module 180 is electrically connected to the second node N2, and the second retention module 180 can maintain the stability of the second node N2.

In an embodiment, with continued reference to FIG. 6, the second retention module 180 includes a third capacitor C3, and the third capacitor C3 serving as an energy storage capacitor can store the signal of the second node N2, to maintain the stability of the second node N2.

It is to be understood that each transistor in the shift register unit G may be an N-channel insulated gate field effect transistor. In this case, an effective level for controlling each transistor to be on is the high level. Alternatively, each transistor in the shift register unit G may be a P-channel insulated gate field effect transistor. In this case, an effective level for controlling each transistor to be on is a low level. For ease of explanation, in the embodiments of the present disclosure, in a case where no special description is provided, the embodiments of the present disclosure is exemplarily described by using an example in which each transistor in the shift register unit G may be the N-channel insulated gate field effect transistor. In some embodiments, with reference to FIG. 1, FIG. 3 and FIG. 6, the sixth-stage shift register unit G6 as the first shift register unit is used as an example.

In a t01 stage, the input signal inf (i.e., the start signal stv) of the first-stage shift register unit G1 is at the effective level, and the first input transistor M1 in the first-stage shift register unit G1 is controlled to be on, so that the scan control signal fw is transmitted to the first node N1 of the first-stage shift register unit G1, thereby the first output transistor M8 of the first-stage shift register unit G1 is on, and the output control signal out received by the first-stage shift register unit G1 is controlled to be output as the gate drive signal gout1. In this stage, since the output control signal out of the first shift register unit G1 is at the effective level, the first shift register unit G1 outputs the effective pulse of the gate drive signal gout1. In addition, in the t01 stage, in the first shift register unit, the high level of the first node N1 controls the second mutual control transistor M7 to be on, the first level signal VGL is transmitted to the second node N2 through the second mutual control transistor M7, and the second node N2 is at the ineffective level, the second output transistor M9 is controlled to be off. Correspondingly, since the input signal inf of the second-stage shift register unit G2 is the gate drive signal gout1 output by the first-stage shift register unit G1, the first input transistor M1 in the second-stage shift register unit G2 is on under the control of the input signal inf (i.e., the gate drive signal gout1) received by the second-stage shift register unit G2, the signal of the first node N1 of the second-stage shift register unit G2 controls the first output transistor M8 of the second-stage shift register unit G2 to on, and the second-stage shift register unit G2 outputs the output control signal out of the second-stage shift register unit G2 as the gate drive signal gout2 of the second-stage shift register unit G2. However, at this time, since the output control signal out of the second-stage shift register unit G2 is at the low level, the second-stage shift register unit G2 outputs the ineffective level of the gate drive signal gout2. Since input signals inf of other stages of shift register units (G3, G4, G5, G6, . . . ) are all at the ineffective level, gate drive signals (gout 3, gout4, gout5, gout6 and . . . ) output by the other stages of shift register units (G3, G4, G5, G6, . . . ) are all at the ineffective level.

In a t02 stage, the reset clock signal rstf received by the first-stage shift register unit G1 becomes at the effective level, thereby in the first-stage shift register unit G1, the effective level of the reset clock signal rstf is transmitted to the gate of the second reset transistor M4 through the first reset transistor M3 to control the second reset transistor M4 to be on, the second level signal VGH is controlled to be transmitted to the second node N2, so that the second node N2 becomes at the effective level, the second output transistor M9 is on, the first level signal vgl is output through the second output transistor M9 and is used as the gate drive signal gout1, the gate drive signal gout1 output by the first-stage shift register unit G1 becomes at the ineffective level, and correspondingly, the input signal inf received by the second-stage shift register unit G2 becomes at the ineffective level. Therefore, in this stage, the reset clock signal rstf of the second-stage shift register unit G2 is maintained at the ineffective level, so that in the second-stage shift register unit G2, the signal of the first node N1 is maintained at the effective level, the signal of the second node N2 is maintained at the ineffective level, and the first output transistor M8 of the second-stage shift register unit G2 continues to be in the on state. In addition, the output control signal out of the second-stage shift register unit G2 is at the effective pulse in this stage, so that the second-stage shift register unit G2 outputs the effective pulse of the gate drive signal gout2. In addition, since the input signal inf of the third-stage shift register unit G3 is the gate drive signal gout2 of the second-stage shift register unit G2, the third-stage shift register unit G3 can output the output control signal out of the third-stage shift register unit G3 as the gate drive signal gout3 of the third-stage shift register unit G3, and since the output control signal out of the third-stage shift register unit G3 is at the ineffective level, the gate drive signal gout3 output by the third-stage shift register unit G3 is also at the ineffective level. Since input signals inf of other stages of shift register units (G4, G5, G6, . . . ) are all at the ineffective level, gate drive signals (gout4, gout5, gout6 and . . . ) output by the other stages of shift register units (G4, G5, G6, . . . ) are all at the ineffective level.

In a t03 stage, the first-stage shift register unit G1 keeps outputting the ineffective level of the gate drive signal gout1. The reset clock signal rstf received by the second-stage shift register unit G2 is at the effective level, thereby in the second-stage shift register unit G2, the effective level of the reset clock signal rstf controls the second node N2 to be at the effective level, the second output transistor M9 is on, the first level signal vgl is output to the gate drive signal output terminal GOUT through the second output transistor M9, and the gate drive signal gout2 output by the second-stage shift register unit G2 becomes at the ineffective level. In addition, in the third-stage shift register unit G3, the input signal inf becomes at the ineffective level, and the reset clock signal rstf of the third-stage shift register unit G3 is also at the ineffective level, so that the third-stage shift register unit G3 continues to keep outputting the output control signal out of the third-stage shift register unit G3 as the gate drive signal gout3, and in this case, the output control signal out of the third-stage shift register unit G3 is at the effective level, so that the third-stage shift register unit G3 outputs the effective level of the gate drive signal gout3. In addition, since the input signal inf of the fourth-stage shift register unit G4 is the gate drive signal gout3 of the third-stage shift register unit G3, the fourth-stage shift register unit G4 outputs the output control signal out of the fourth-stage shift register unit G4 as the gate drive signal gout4 of the fourth-stage shift register unit G4, and since the output control signal out of the fourth-stage shift register unit G4 is at the ineffective level, the gate drive signal gout4 of the fourth-stage shift register unit G4 is at the ineffective level. Since input signals inf of other stages of shift register units (G5, G6, . . . ) are all at the ineffective level, gate drive signals (gout5, gout6 and . . . ) output by the other stages of shift register units (G5, G6, . . . ) are all at the ineffective level.

In a t04 stage, based on the same principle, the first-stage shift register unit G1 keeps outputting the ineffective level of the gate drive signal gout1, the second-stage shift register unit G2 also keeps outputting the ineffective level of the gate drive signal gout2, the reset clock signal rstf of the third-stage shift register unit G3 controls the third-stage shift register unit G3 to output the ineffective level of the gate drive signal gout3, the fourth-stage shift register unit G4 outputs the effective level of the gate drive signal gout4, the fifth-stage shift register unit G5 outputs the output control signal out of the fifth-stage shift register unit G5 as a gate drive signal gout5, where the gate drive signal gout5 is at the ineffective level, and gate drive signals (gout 6, . . . ) output by other stages of shift register units (G6, . . . ) are all at the ineffective level.

In a t05 stage, based on the same principle, the first-stage shift register unit G1 to the fourth-stage shift register unit G4 output the ineffective level of the gate drive signal (gout1, gout2, gout3, gout4), and the fifth-stage shift register unit G5 outputs the effective pulse of the gate drive signal gout4. The sixth-stage shift register unit G6 is capable of receiving the effective level of the input signal inf, so that the sixth-stage shift register unit G6 outputs the output control signal out of the sixth-stage shift register unit G6 as the gate drive signal gout6. Since the output control signal out of the sixth-stage shift register unit G6 is at the ineffective level, the gate drive signal gout6 of the sixth-stage shift register unit G6 is also maintained at an ineffective level. In addition, other stages of shift register units after the sixth-stage shift register unit G6 continues to output the ineffective level of the gate drive signal.

In a t06 stage, in the sixth-stage shift register unit G6, the output control signal out continues to keep at the ineffective level, and the reset clock signal rstf changes to be at the effective level. That is, before an effective pulse of the output control signal out of the sixth-stage shift register unit G6 arrives, the sixth-stage shift register unit G6 is configured to receive the effective pulse of the reset clock signal rstf. In this case, the effective pulse of the reset clock signal rstf controls the second node N2 in the sixth-stage shift register unit G6 to be at the ineffective level, and controls the first node N1 to be at the ineffective level through the first mutual control transistor M6, so that the first output transistor M8 of the sixth-stage register unit G6 is off, a ninth output transistor M9 is on, and the first level signal vgl is output as the gate drive signal gout6 of the sixth-stage shift register unit G6, that is, the gate drive signal gout6 output by the sixth-stage shift register unit G6 is still kept at the ineffective level, thereby other stages of shift register units after the sixth-stage shift register unit G6 continue to output the ineffective level of the gate drive signal.

In a t07 stage, the output control signal out of the sixth-stage shift register unit G6 becomes at the effective level, that is, after the effective pulse of the reset clock signal rstf of the sixth-stage shift register unit G6, the sixth-stage shift register unit G6 is configured to receive the effective pulse of the output control signal out. However, since the first output transistor M8 is in the off state, the output control signal out cannot be output to the gate drive signal output terminal GOUT through the first output transistor M8. In this case, the gate drive signal gout6 of the sixth-stage shift register unit G6 is still the first level signal vgl, that is, the gate drive signal gout6 of the sixth-stage shift register unit G6 is at the ineffective level. In addition, in a subsequent process, the sixth-stage shift register unit G6 cannot receive the effective level of the input signal inf, so that the sixth-stage shift register unit G6 cannot output the output control signal out of the sixth-stage shift register unit G6 as the gate drive signal gout6, that is, the sixth-stage shift register unit G6 cannot output the effective pulse of the gate drive signal gout6, so that the sixth-stage shift register unit G6 and other stages of shift register units after the sixth-stage shift register unit G6 output the ineffective level of the gate drive signal.

In this way, in the display panel 100, multiple stages of shift register units of the first-stage shift register unit G1 to the fifth-stage shift register unit G5 can sequentially output the effective level of the gate drive signal, so that the signal refresh can be performed on the pixel circuits 20 connected to the first-stage shift register unit G1 to the fifth-stage shift register unit G5 row by row. Moreover, gate drive signals output from the sixth-stage shift register unit G6 to a last-stage shift register unit are maintained at the ineffective level, so that the signal refresh cannot be performed on each row of pixel circuits 20 connected to the sixth-stage shift register unit G6 to the last-stage shift register unit. In this case, a region where each row of pixel circuits electrically connected to each-stage shift register unit of the first-stage shift register unit G1 to the fifth-stage shift register unit G5 is located is the first sub-display region A21, and a region where each row of pixel circuits electrically connected to each-stage shift register unit of the six-stage shift register unit G6 to the last-stage shift register unit is located is the second sub-display region A22. Since the pixel circuit in the first sub-display region A21 can continuously performs the signal refresh, and the pixel circuit in the second sub-display region A22 cannot performs the signal refresh, thereby a display refreshing frequency of the first sub-display region A21 is greater than a display refreshing frequency of the second sub-display region A22, so that the power consumption of the display panel can be effectively reduced while ensuring the display quality. Therefore, on the premise that display quality can be ensured and the power consumption of the display panel can be reduced, the cascading manner of the shift register in the driver circuit and the structure of each-stage shift register in the driver circuit do not need to be changed, and a time interval between an effective pulse of the reset clock signal and/or and an effective pulse of the output control signal is adjusted only according to the display requirement of the display panel, so that the signal refresh frequency of the pixel circuit electrically connected to at least part of the shift registers can be controlled. Therefore, the design of the display panel is simplified while the complexity of the driver circuit is not increased, and thus the narrow frame design of the display panel is facilitated.

It is to be understood that the foregoing is only exemplarily described by using an example in which the display refresh frequency of the first sub-display region A21 is greater than the display refresh frequency of the second sub-display region A22. In the embodiments of the present disclosure, the display refresh frequency of the first sub-display region A21 may also be made less than the display refresh frequency of the second sub-display region A22. In this case, the gate drive signals gout output by the multiple stages of shift register units G electrically connected to the pixel circuit in the first sub-display area A21 may be kept at the ineffective level through the reverse scanning process of the driver circuit. The specific driving process is similar to the forward scanning process described above, and reference may be made to the above description for the same points, which is not limited in detail here.

In an embodiment, with continued reference to FIG. 1, FIG. 2, FIG. 3 and FIG. 6, in the first display frame T1 and the first shift register unit 11, the input signal inf includes an effective pulse IEP, the reset clock signal rstf includes a first reset effective pulse REP1, and the first-type output control signal out' includes one first output effective pulse CEP1. In each effective pulse of the reset clock signal rstf, the first effective pulse after the effective pulse EP1 of the input signal inf is the first reset effective pulse REP1. In effective pulses of the first-type output control signal out', a first effective pulse after the effective pulse IEP of the input signal inf is the first output effective pulse CEP1. Time of the first reset effective pulse REP1 is before time of the first output effective pulse CEP1.

In an embodiment, that the sixth-stage shift register unit G6 is the first shift register unit 11 is used as an example. Since the input signal inf of the sixth-stage shift register unit G6 is the gate drive signal gout5 of the fifth-stage shift register unit G5, so that in effective pulses of the reset clock signal rstf (the fourth clock signal ck4), a first effective pulse after the effective pulse IEP of the gate drive signal gout5 is the first reset effective pulse REP1, and in effective pulses of the first-type output control signal out', a first effective pulse after the effective pulse IEP of the gate drive signal gout5 is the first output effective pulse CEP1. The time of the first reset effective pulse REP1 is set to be before the time of the first output effective pulse CEP1, so that the reset module 120 of the sixth shift register unit G6 may reset the signal of the first node N1 of the sixth shift register unit G6 before the output module 140 of the sixth shift register unit G6 is configured to receive the effective pulse of the first-type output control signal out', and the signal of the first node N1 becomes at the ineffective level. When the output module 140 is configured to receive the first output effective pulse CEP1 of the first-type output control signal out', the first output transistor M8 is in the off state, and the output module 140 cannot output the first output effective pulse EP3 of the first-type output control signal out', so that the gate drive signal gout6 output by the sixth-stage shift register unit G6 cannot control the pixel circuit connected to the sixth-stage shift register unit G6 to perform the signal refreshing. In this way, input signals inf received by other stages of shift register units G that are cascaded with the sixth-stage shift register unit G6 and that are located after the sixth-stage shift register unit G6 are always at the ineffective level, so that gate drive signals gout output by the other stages of shift register units G that are located after the sixth-stage shift register unit G6 are continuously maintained at the ineffective level, and pixel circuits connected to the sixth-stage shift register unit G6 and other stages of shift register units G after the sixth-stage shift register unit G6 cannot perform the signal refreshing, thereby the two sub-display regions of the display panel 100 have different refresh frequencies without increasing the complexity of the driver circuit 10, and the power consumption of the display panel 100 can be effectively reduced.

In an embodiment, with continued reference to FIG. 1, FIG. 2, FIG. 3 and FIG. 6, in the first display frame T1, the reset clock signal rstf of the first shift register unit 11 further includes one second reset effective pulse REP2. Time of the second reset effective pulse REP2 is before time of the first reset effective pulse REP1, and the first reset effective pulse REP1 and the second reset effective pulse REP2 are two adjacent effective pulses. A time interval between the first reset effective pulse REP1 and the second reset effective pulse REP2 is the second time interval t2; In the first display frame T1, the first-type output control signal out' of the first shift register unit 11 further includes one second output effective pulse CEP2. Time of the second output effective pulse CEP2 is before time of the first output effective pulse CEP1, and the first output effective pulse CEP1 and the second output effective pulse CEP2 are two adjacent effective pulses. A time interval between the first output effective pulse CEP1 and the second output effective pulse CEP2 is the first time interval t1. Time of the second output effective pulse CEP2 is before the time of the second reset effective pulse REP2.

In an embodiment, the time of the second output effective pulse CEP2 is before the time of the second reset effective pulse REP2, that is, before the first reset effective pulse REP1, the effective pulse of the reset clock signal rstf received by the first shift register unit is after the effective pulse CEP2 of the first-type output control signal out' received by the first shift register unit. Therefore, before the first reset effective pulse REP1, the normal operation of each-stage shift register unit G can be ensured, and the accurate display of the display panel 100 can be ensured.

Figure 7:
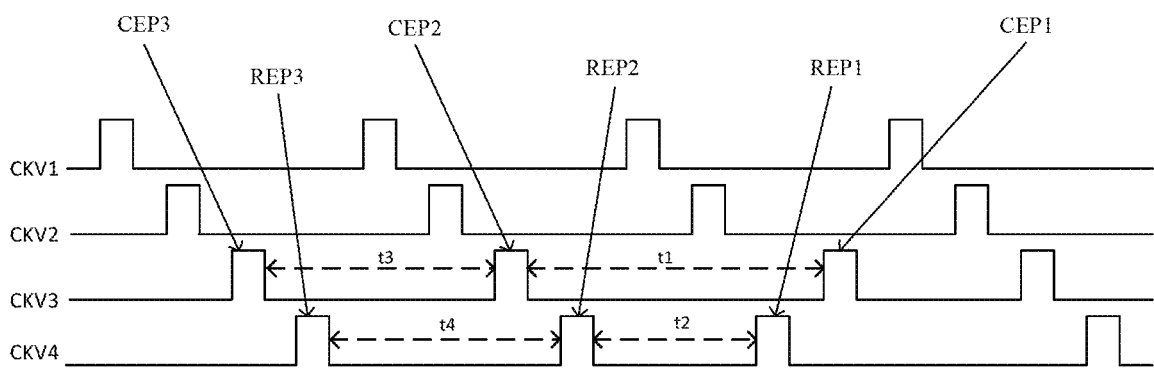
FIG. 7 is a drive timing diagram of still another shift register unit according to an embodiment of the present disclosure.

In an embodiment, FIG. 7 is a drive timing diagram of still another shift register unit according to an embodiment of the present disclosure. With reference to FIG. 1, FIG. 2, FIG. 3 and FIG. 7, in the first display frame T1 and the first shift register unit 11, the reset clock signal rstf further includes at least one third reset effective pulse REP3 before the second reset effective pulse REP2, and the first-type output control signal out' further includes at least one third output effective pulse CEP3 before the second output effective pulse CEP2. In the first-type output control signal out', a time interval between the second output effective pulse CEP2 and the third output effective pulse adjacent to the second output effective pulse CEP2 is a third time interval t3. In the reset clock signal rstf, a time interval between the second reset effective pulse REP2 and the third reset effective pulse REP3 adjacent to the second reset effective pulse REP2 is a fourth time interval t4. The third time interval t3 is equal to the fourth time interval t4.

It is to be understood that, in the reset clock signal rstf, time intervals between effective pulses before the second reset effective pulse REP2 may be equal. In the first-type output control signal out', time intervals between effective pulses before the second output effective pulse CEP2 may be equal. The third time interval t3 is set to be equal to the fourth time interval t4, that is, before the second reset effective pulse REP2 and the second output effective pulse CEP2, each effective pulse time interval of the reset clock signal rstf may be equal to each effective pulse time interval of the first-type output control signal out', thereby it can be ensured that the each-stage shift register unit 11 can accurately output the gate drive signal gout.

In an embodiment, with continued reference to FIG. 1, FIG. 2, FIG. 3 and FIG. 7, the first time interval t1 is greater than the third time interval t3, and the second time interval t2 is less than the fourth time interval t4.

In an embodiment, on the basis that the third time interval t3 is equal to the fourth time interval t4, the first time interval t1 is set to be greater than the third time interval t3, and the second time interval t2 is set to be less than the fourth time interval t4. In this way, when the first-type output control signal out' and the reset clock signal rstf are provided to the first shift register unit 11, the first output effective pulse CEP1 of the first-type output control signal out' may be controlled to be provided to the first shift register unit 11 after a preset time is postponed, and the first reset effective pulse REP1 is provided to the first shift register unit 11 in advance of a predetermined time. In this case, the first reset effective pulse REP1 of the reset clock signal rstf may be provided to the first shift register unit 11 within a time period that is originally intended to provide the first output effective pulse CEP1 of the first-type output control signal out', and the first output effective pulse CEP1 of the first-type output control signal out' may be provided to the first shift register unit 11 within a time period that is originally intended to provide the first reset effective pulse REP1 of the reset clock signal rstf, so that before the first output effective pulse CEP1 of the first-type output control signal out' is provided to the output module 140 of the first shift register unit 11, the first reset effective pulse REP1 of the reset clock signal rstf may be firstly provided to the reset module 130 of the first shift register unit 11 to reset the signal of the first node N1 and the signal of the second node N2, thereby the first output effective pulse CEP1 of the first-type output control signal out' cannot be output through the output module 140, and thus the gate drive signal gout output by the first shift register unit 11 cannot control the pixel circuit 20 connected to the first shift register unit 11 to perform the signal refresh.

Figure 8:
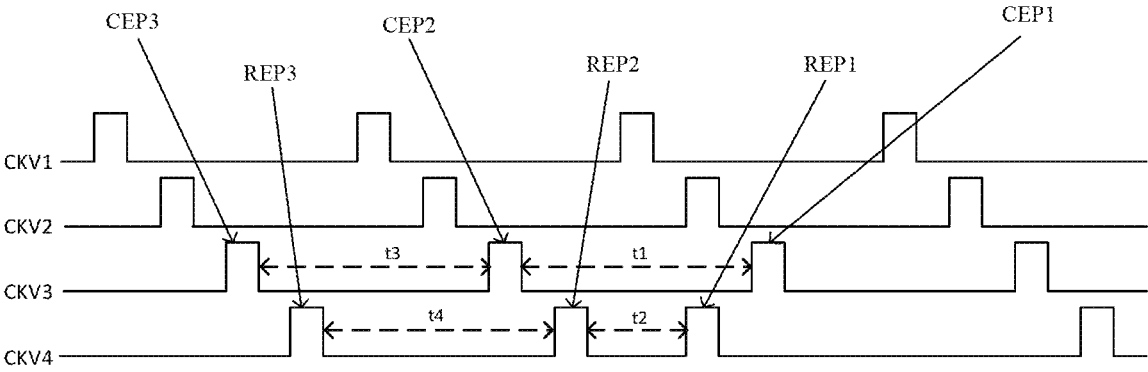
FIG. 8 is a drive timing diagram of another shift register unit according to an embodiment of the present disclosure.

In an embodiment, FIG. 8 is a drive timing diagram of another shift register unit according to an embodiment of the present disclosure. With reference to FIG. 1, FIG. 2, FIG. 3 and FIG. 8, the first time interval t1 is equal to the third time interval t3, and the second time interval t2 is less than the fourth time interval t4.

In an embodiment, on the basis that the third time interval t3 is equal to the fourth time interval t4, the first time interval t1 is set to be equal to the third time interval t3, and the second time interval t2 is set to be less than the fourth time interval t4. In this way, only the time of the first reset effective pulse REP1 of the reset clock signal rstf may be advanced without changing the first-type output control signal out'. Similarly, before the first output effective pulse CEP1 of the first-type output control signal out' is transmitted to the output module 140, the reset module 130 may reset the signal N1 of the first node according to the first effective reset pulse REP1.

Figure 9:
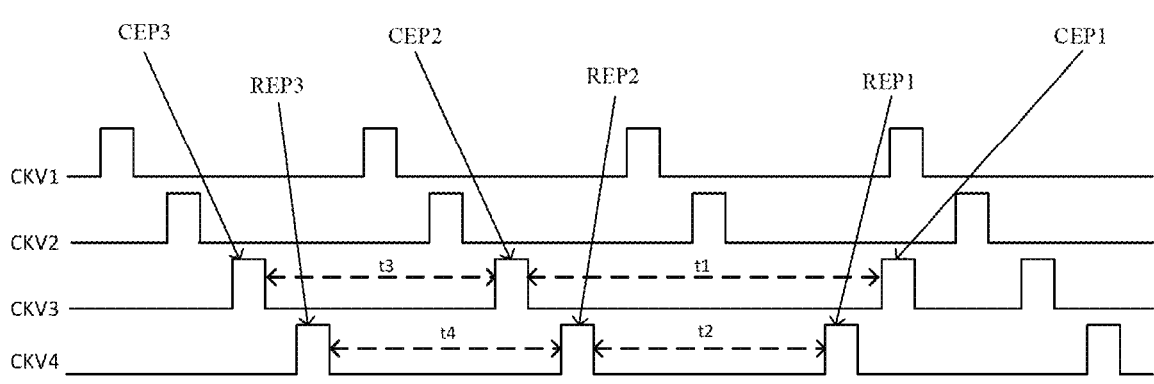
FIG. 9 is a drive timing diagram of still another shift register unit according to an embodiment of the present disclosure.

In an embodiment, FIG. 9 is a drive timing diagram of still another shift register unit according to an embodiment of the present disclosure. With reference to FIG. 1, FIG. 2, FIG. 3 and FIG. 9, the first time interval t1 is greater than the third time interval t3, and the second time interval t2 is equal to the fourth time interval t4.

In an embodiment, on the basis that the third time interval t3 is equal to the fourth time interval t4, the first time interval t1 is set to be greater than the third time interval t3, and the second time interval t2 is set to be equal to the fourth time interval t4. In this way, only the time of the first output effective pulse CEP1 of the first-type output control signal out' may be delayed without changing the reset clock signal rstf. Similarly, before the first output effective pulse CEP1 of the first-type output control signal out' is transmitted to the output module 140, the reset module 130 may reset the signal of the first node N1 according to the first reset effective pulse REP1.

Figure 10:
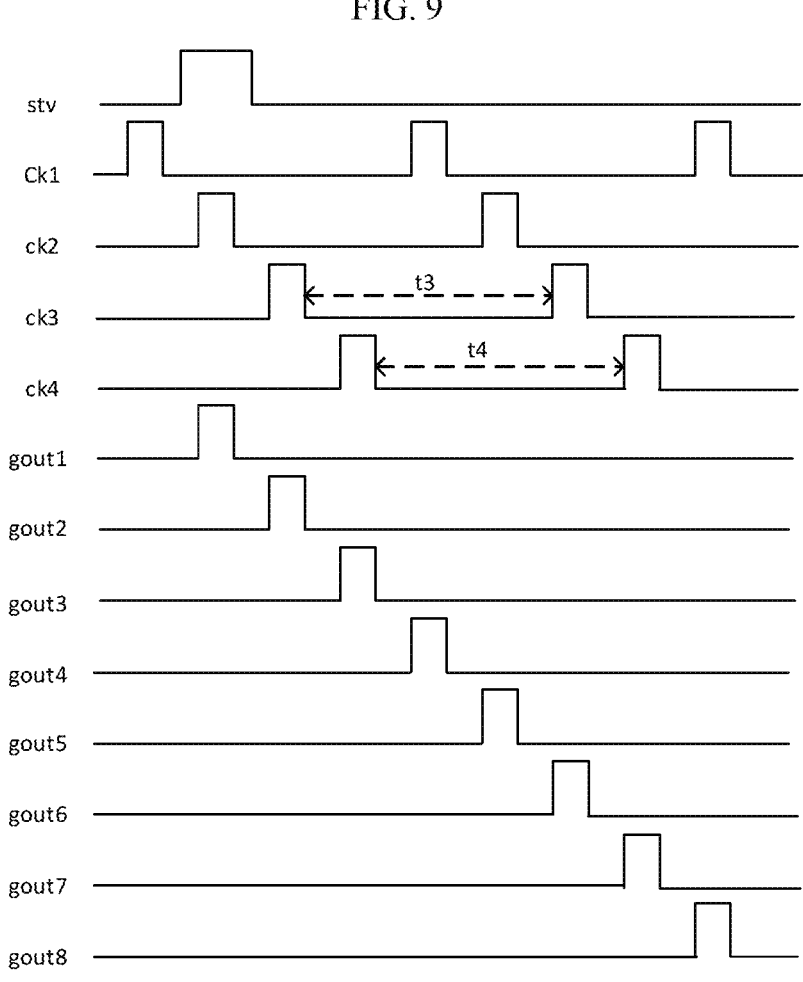
FIG. 10 is a drive timing diagram of still another shift register unit according to an embodiment of the present disclosure.

On the basis of the above-described embodiments, in an embodiment, FIG. 10 is a drive timing diagram of still another shift register unit according to an embodiment of the present disclosure. With reference to FIG. 1, FIG. 6 and FIG. 10, the display panel 100 further includes a second mode Mode2. In one display frame in the second mode Mode2 and in the same shift register unit G, a time interval t3 of two effective pulses adjacent to the output control signal out is equal to a time interval t4 of two effective pulses adjacent to the reset clock signal rstf. In this way, multiple stages of shift register units G can sequentially output the effective pulse of the gate drive signal gout, so that line-by-line scanning of the pixel circuit 20 can be implemented, thereby ensuring the display quality of the display image.

In an embodiment, with reference to FIG. 1 and FIG. 3, when N is equal to 1, the gate drive signal goutj of the j-th-stage shift register unit Gj is an input signal inf of the (j+1)-th-stage shift register unit Gj+1, where j is a positive integer. The reset clock signal rstf of the j-th-stage shift register unit Gj also serves as a reset clock signal rstf of a (j+4)-th-stage shift register unit Gj+4, and/or the output control signal out of the j-th-stage shift register unit Gj also serves as an output control signal out of the (j+4)-th-stage shift register unit Gj+4.

In an embodiment, when N=1, the gate drive signal goutj of the j-th-stage shift register unit Gj is set to be the input signal inf of the (j+1)-th-stage shift register unit Gj+1, so that each shift register unit G is sequentially disposed in cascade. In this case, based on the above-described timing analysis, it can be learned that the effective pulse time of the reset clock signal rstf of the j-th-stage shift register unit Gj may be the same time as the effective pulse time of the reset clock signal rstf of the (j+4)-th-stage shift register unit Gj+4, for example, the effective pulse time of the reset clock signal rstf of the first-stage shift register unit G1 may be the same time as the effective pulse time of the reset clock signal rstf of the fifth-stage shift register unit G5. Therefore, the reset clock signal rstf of the first-stage shift register unit G1 may also serve as the reset clock signal rstf of the fifth-stage of shift register unit G5, that is, the reset clock signal rstf of the j-th-stage shift register unit Gj also serves as the reset clock signal rstf of the (j+4)-th-stage shift register unit Gj+4. In this way, the number of signals supplied to the driver circuit 10 can be reduced and the number of signal lines supplying clock signals to the driver circuit 10 can be reduced while ensuring that each-stage shift register unit G outputs the drive control signal gout normally, which is favorable for the narrow frame design of the display panel 100.

It should be noted that the technical solutions of the present disclosure are described exemplarily in the above-described embodiments by using a case of N=1. In other feasible embodiments of the present disclosure, N≥2 may be further set. In this case, the shift register unit G includes two or more output modules 140.

Figure 11:
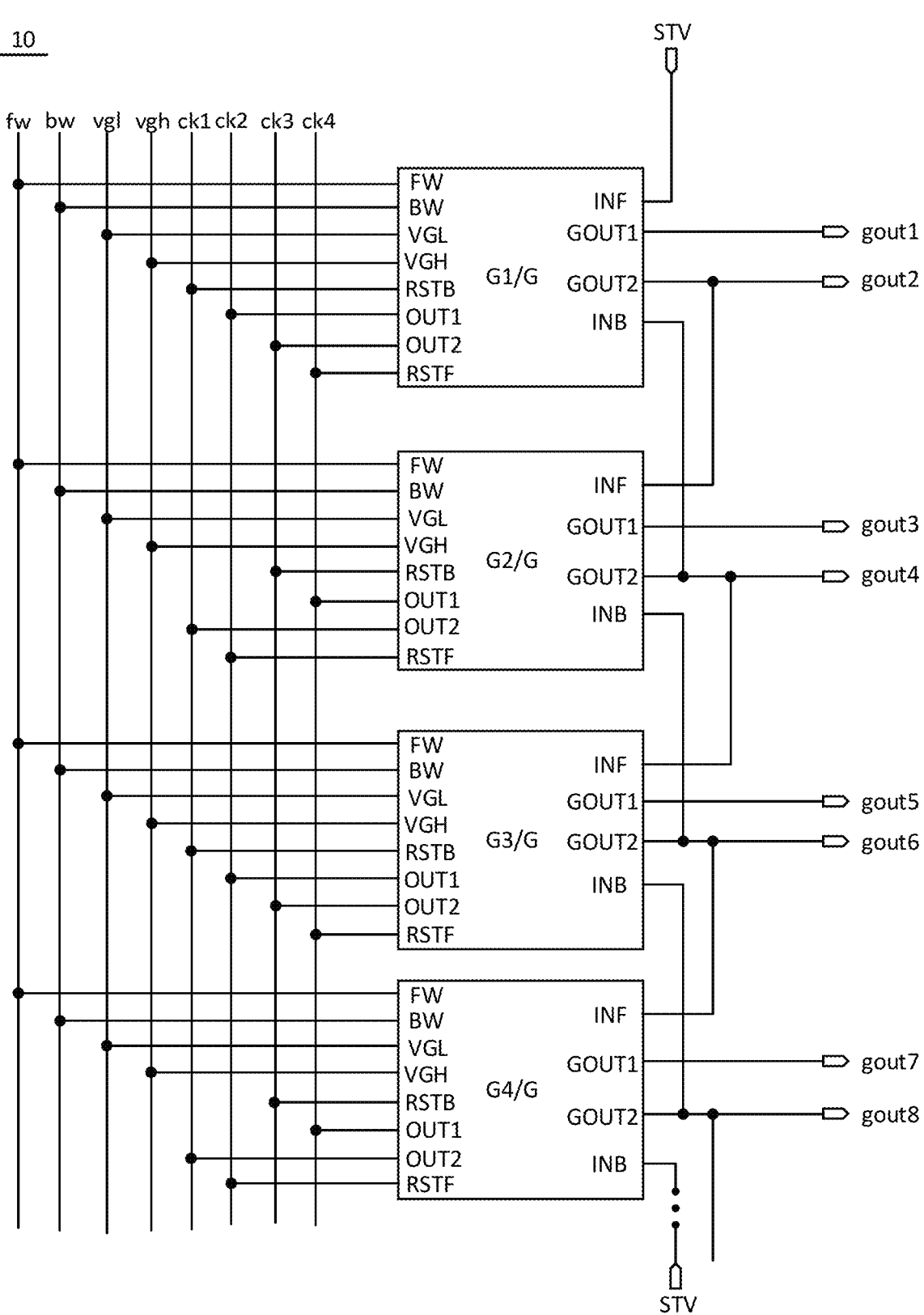
FIG. 11 is a schematic structural diagram of a driver circuit according to an embodiment of the present disclosure.
Figure 12:
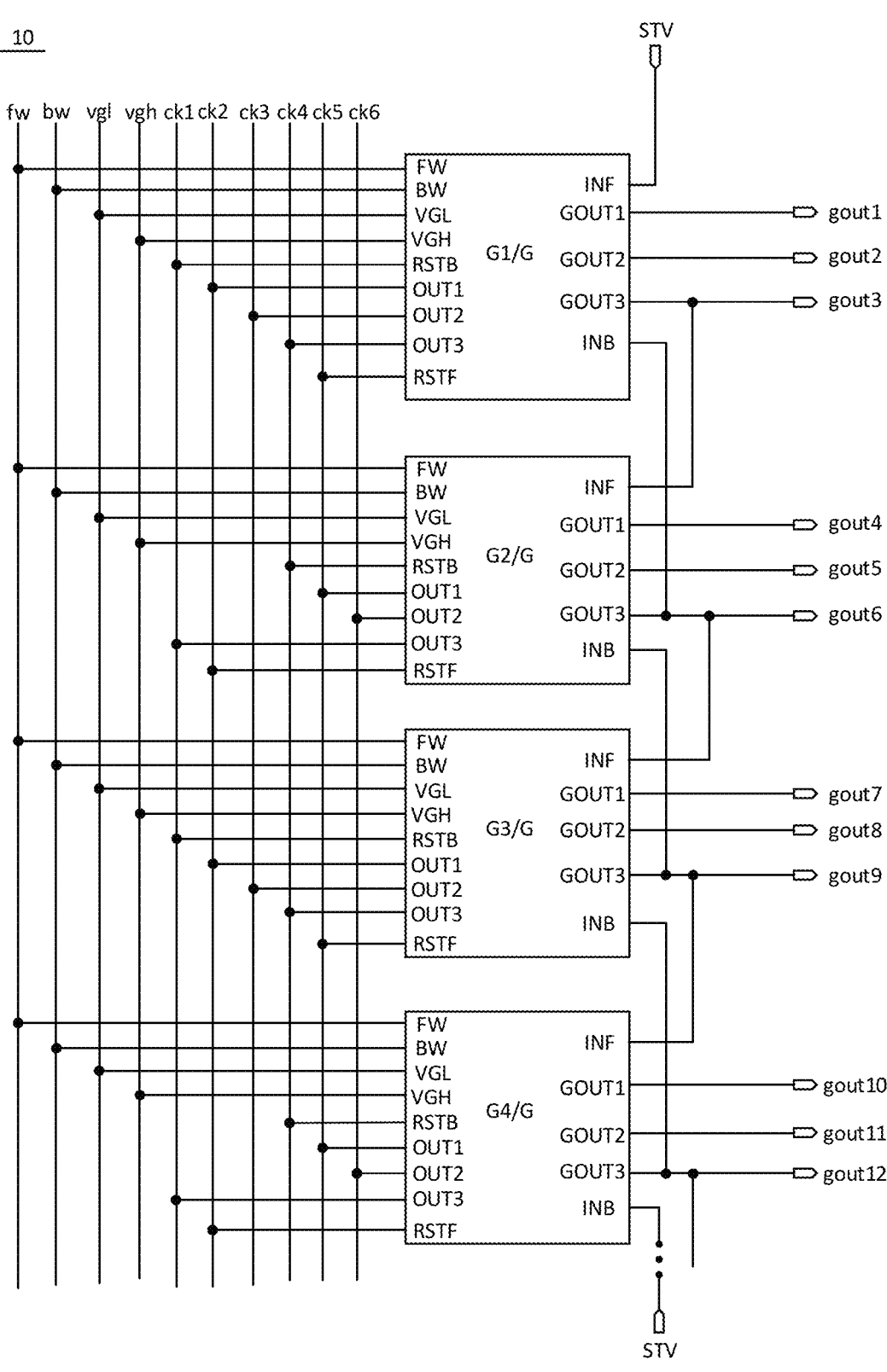
FIG. 12 is a schematic structural diagram of another driver circuit according to an embodiment of the present disclosure.
Figure 13:
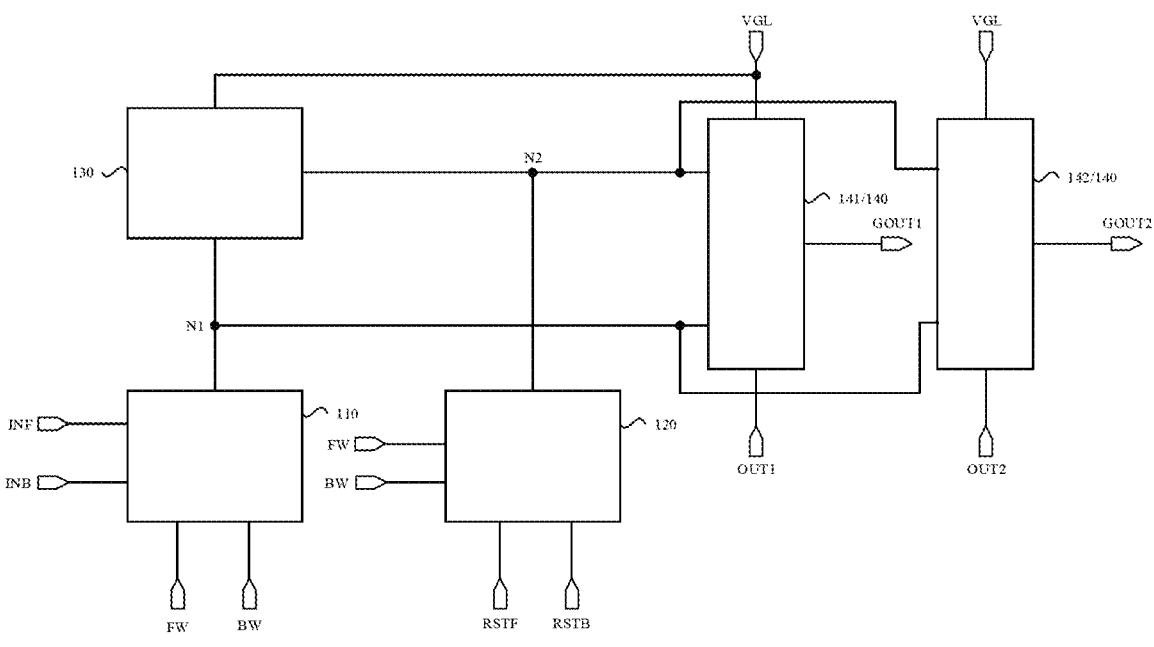
FIG. 13 is a schematic structural diagram of still another shift register unit according to an embodiment of the present disclosure.
Figure 14:
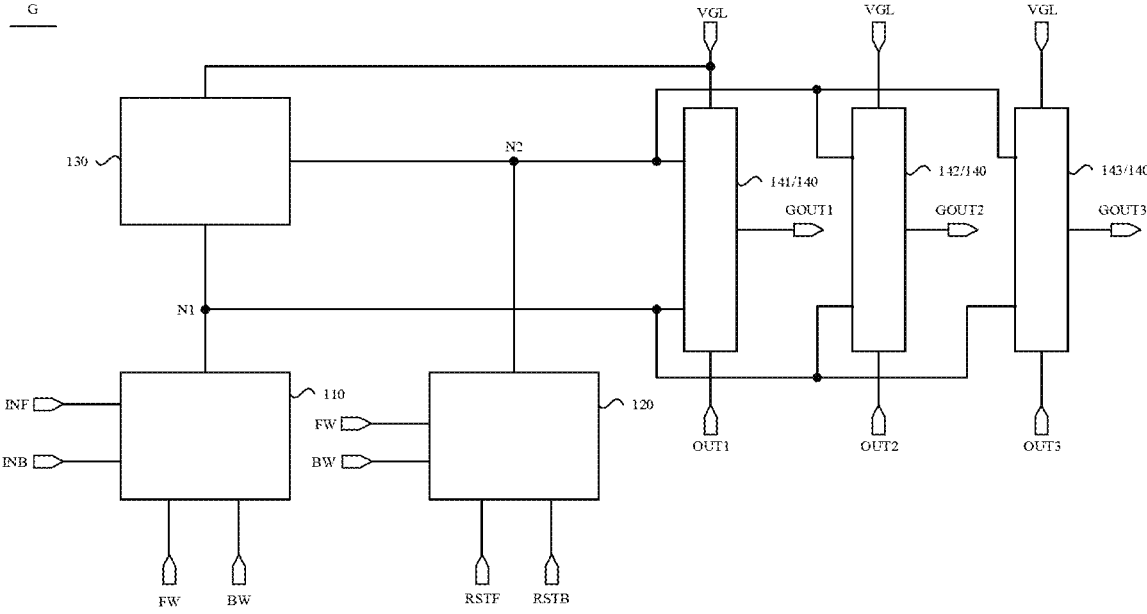
FIG. 14 is a schematic structural diagram of still another shift register unit according to an embodiment of the present disclosure.

In an optional embodiment, FIG. 11 is a schematic structural diagram of a driver circuit according to an embodiment of the present disclosure, FIG. 12 is a schematic structural diagram of another driver circuit according to an embodiment of the present disclosure, and FIG. 13 and FIG. 14 are schematic structural diagrams of still another shift register unit according to an embodiment of the present disclosure. With reference to FIG. 11 and FIG. 13, or with reference to FIG. 12 and FIG. 14, the shift register unit G includes multiple output modules 140, that is, N is greater than or equal to 2, and gate drive signals gout of output modules 140 in the same shift register unit G may be provided to different rows of pixel circuits 20, separately, so that one shift register unit G may provide gate drive signals to N rows of pixel circuits 20, and the number of shift register units G disposed in the driver circuit 10 may be greatly reduced, thereby facilitating the narrow frame design of the display panel.

It should be understood that when the shift register unit G includes multiple output modules 140, effective levels of the gate drive signals gout output by the output modules 140 of the same shift register unit G may be shifted sequentially, and effective levels of gate drive signals gout output by output modules of adjacent two-stage shift register units G may be shifted sequentially, in this way, the progressive scanning of the pixel circuit 20 can be implemented. Alternatively, an effective level time of the gate drive signal output by each output module 140 of the same shift register unit may be set in another form, which is not specifically limited in the embodiments of the present disclosure. In a case where no special description is provided, an example in which effective levels of gate drive signals gout output by output modules 140 of the same shift register unit G are shifted sequentially, and gate drive signals gout output by output modules 140 of adjacent two-stage shift register units G are shifted sequentially is used as an example for exemplary description in the following embodiments.

In an embodiment, when the shift register unit G includes multiple output modules 140, that is, N is greater than or equal to 2, at least one gate drive signal gouti of the i-th-stage shift register unit Gi is the input signal inf of the j-th-stage shift register unit Gj. In this way, the j-th-stage shift register unit Gj may output the gate drive signal goutj according to the at least one gate drive signal gouti.

In an optional embodiment, when the shift register unit G includes multiple output modules 140, the i-th-stage shift register unit Gj may be disposed to be electrically connected to the even number of gate drive signal lines SCAN (as shown in FIG. 11), or the i-th-stage shift register unit Gj may be disposed to be electrically connected to the odd number of gate drive signal lines SCAN (as shown in FIG. 12).

In some embodiments, with reference to FIG. 11 and FIG. 13, the shift register unit G includes two output modules 140, and the two output modules 140 are a first output module 141 and a second output module 142, separately. The first output module 141 is electrically connected to the first level signal terminal VGL, the first-type output control signal terminal OUT1, a first gate drive signal terminal GOUT1, the first node N1 and the second node N2 and is configured to control a first gate drive signal provided to the first gate drive signal terminal GOUT1 according to at least the first level signal vgl provided by the first level signal terminal VGL, the output control signal out1 received by the first-type output control signal terminal OUT1, the signal of the first node N1, and the signal of the second node N2. The second output module 142 is electrically connected to the first level signal terminal VGL, the second output control signal terminal OUT2, a second gate drive signal terminal GOUT2, the first node N1 and the second node N2 and is configured to control a second gate drive signal provided to the second gate drive signal terminal GOUT2 according to at least the first level signal vgl provided by the first level signal terminal VGL, the output control signal out2 of the second output control signal terminal OUT2, the signal of the first node N1, and the signal of the second node. In this case, shift register units G may be electrically connected to two gate drive signal lines SCAN, separately, and the two gate drive signal lines SCAN may be electrically connected to two adjacent rows of pixel circuits, separately, to control the two adjacent rows of pixel circuits to perform the signal refreshing. In addition, the second gate drive signal terminal GOUT2 of the i-th-stage shift register unit Gi may also be electrically connected to an forward input terminal INF of the j-th-stage shift register unit Gj and a reverse input terminal INB of an m-th-stage shift register unit Gm, so that the gate drive signal output by the second gate drive signal terminal GOUT2 of the i-th-stage shift register unit Gi can be used as the forward input signal of the forward input terminal INF of the j-th-stage shift register unit Gj and the reverse input signal of the reverse input terminal INB of the m-th-stage shift register unit Gm, where m<i<j, and m, i, and j are all positive integers.

In an exemplary embodiment, the second gate drive signal terminal GOUT2 of the third-stage shift register unit G3 may simultaneously be electrically connected to the reverse input terminal INB of the second-stage shift register unit G2 and the forward input terminal INF of the fourth-stage shift register unit G4, so that in the forward scanning process, the gate drive signal gout6 output by the second gate drive signal terminal GOUT2 of the third-stage shift register unit G3 may be used as an input signal of the forward input terminal INF of the fourth-stage shift register unit G4, and in the reverse scanning process, the gate drive signal gout6 output by the second gate drive signal terminal GOUT2 of the third-stage shift register unit G3 may be used as an input signal of the reverse input terminal INB of the second-stage shift register unit G2.

Figure 15:
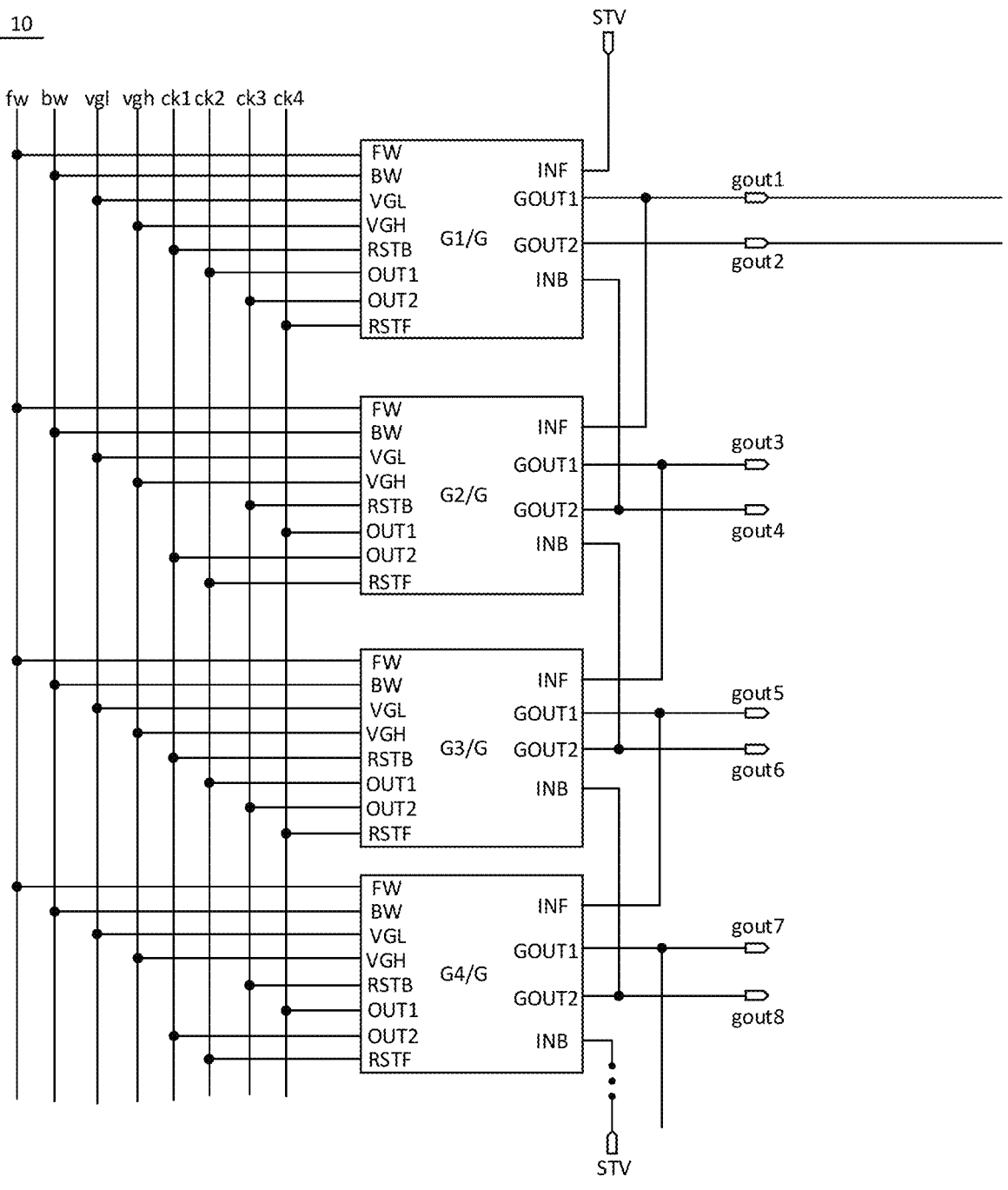
FIG. 15 is a schematic structural diagram of still another shift register unit according to an embodiment of the present disclosure.

In another optional embodiment, FIG. 15 is a schematic structural diagram of still another shift register unit according to an embodiment of the present disclosure. With reference to FIG. 15 and FIG. 12, when the i-th-stage shift register unit Gi includes two output modules 140, and the two output modules 140 are the first output module 141 and the second output module 142, separately. In the i-th-stage shift register unit Gi, the first gate drive signal terminal GOUT1 electrically connected to the first output module 141 may be electrically connected to the forward input terminal INF of the j-th-stage shift register unit Gj, and the second gate drive signal terminal GOUT2 electrically connected to the second output module 141 may be electrically connected to the invert input terminal INB of the m-th-stage shift register unit Gm. For example, the first gate drive signal terminal GOUT1 of the third-stage shift register unit may be electrically connected to the forward input terminal INF of the fourth-stage shift register unit G4, and the second gate drive signal terminal GOUT2 of the third-stage shift register unit may be electrically connected to the reverse input terminal INB of the second-stage shift register unit G2.

In other optional embodiments, when the i-th-stage shift register unit includes two output modules, and the two output modules are a first output module and a second output module, separately. In the i-th-stage shift register unit, a second gate drive signal terminal electrically connected to the first output module may be electrically connected to the forward input terminal of the j-th-stage shift register unit, and a first gate drive signal terminal electrically connected to the second output module may be electrically connected to the reverse input terminal of the m-th-stage shift register unit.

It is to be understood that, the cascaded manner of the shift register unit is exemplarily described in the foregoing by using an example in which each shift register unit includes two output modules. On the premise that the core invention point of the embodiments of the present disclosure can be implemented, the number of output modules included in each-stage shift register unit is not specifically limited in the embodiments of the present disclosure.

Figure 16:
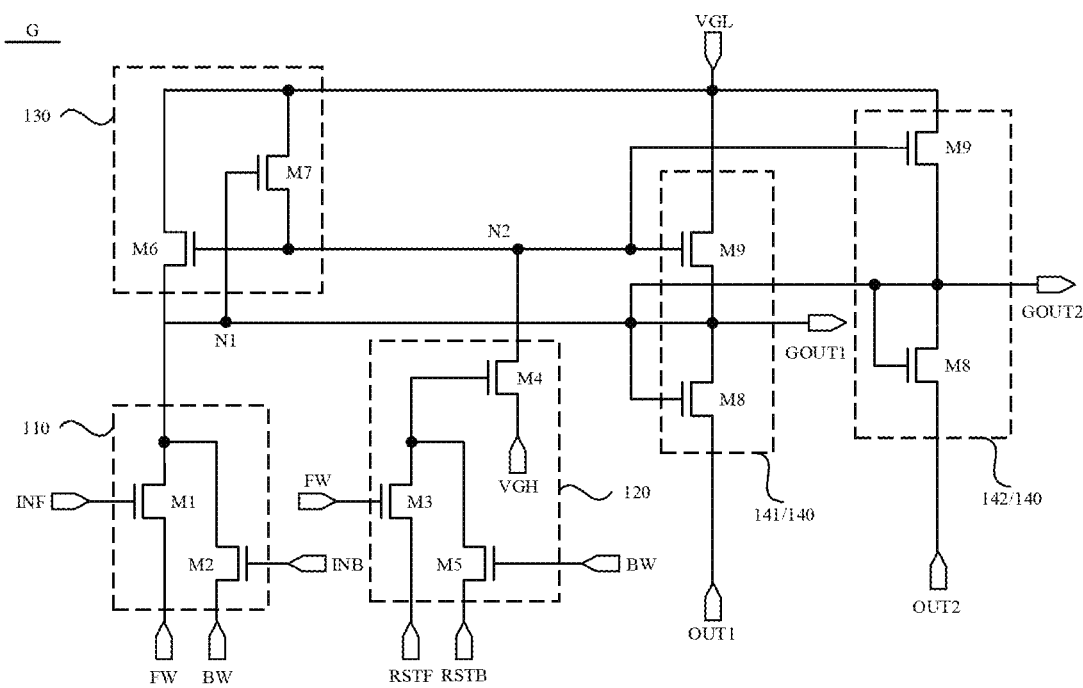
FIG. 16 is a schematic structural diagram of still another shift register unit according to an embodiment of the present disclosure.

In an embodiment, FIG. 16 is a schematic structural diagram of still another shift register unit according to an embodiment of the present disclosure. Referring to FIG. 16 or FIG. 14, when N is greater than or equal to 2, a circuit structure of each module in the shift register unit G is the same as that when N=1. The following only describes different aspects. When N is greater than or equal to 2, in the same shift register unit G, the output modules 140 receives different output control signals out, respectively, and effective pulse time of output control signals out received by shift register units G is shifted sequentially.

In some embodiments, as shown in FIG. 16, each shift register unit G includes two output modules 140, and the two output modules 140 of the same shift register unit G are the first output module 141 and the second output module 142, separately. The effective pulse of the gate drive signal output by the first output module 141 is provided by the output control signal out1 received by the first output module 141, the effective pulse of the gate drive signal output by the second output module 142 is provided by the output control signal out2 received by the second output module 142;

therefore, the output control signals out received by the first output module 141 and the second output module 142 to set to be sequentially shifted, so that the effective pulse time of the gate drive signal output by the first output module 141 and the effective pulse time of the gate drive signal output by the second output module 142 can be sequentially shifted, thereby when the two output modules 140 are electrically connected to the different rows of pixel circuits, separately, the two rows of pixel circuits can be controlled in a time-sharing manner to perform the signal refreshing, and thus the display accuracy of the display panel 100 is ensured.

In an embodiment, referring to FIG. 11 or FIG. 12, when the shift register unit G includes N output modules, in the same shift register unit G, an output control signal out received by a k-th output module 14k is a k-th output control signal outk, and an effective pulse time of the k-th output control signal outk is before an effective pulse time of a (k+1)-th output control signal outk+1, where K is a positive integer, and k is less than N. A gate drive signal gout output by one of the first output module 141 or the N-th output module 14N of the i-th-stage shift register unit G is an input signal inf received by the input module 110 in the j-th-stage shift register unit Gj.

In some embodiments, as shown in FIG. 12 and FIG. 14, that the shift register unit G includes three output modules 140 is used as an example. Three output modules 140 of the same shift register unit G are the first output module 141, the second output module 142, and a third output module 143, separately. An effective pulse time of the first output control signal out1 received by the first output module 141 is before an effective pulse time of the second output control signal out2 received by the second output module 142, and an effective pulse time of the second output control signal out2 received by the second output module 142 is before an effective pulse time of the third output signal out2 received by the third output module 143, so that the effective pulse time of the gate drive signal output by the first drive signal output terminal GOUT1 electrically connected to the first output module 141 is before the effective pulse time of the gate drive signal output by the second drive signal output terminal GOUT2 electrically connected to the second output module 142, and the effective pulse time of the gate drive signal output by the second drive signal output terminal GOUT2 electrically connected to the second output module 142 is before the effective pulse time of the gate drive signal output by the third drive signal output terminal GOUT3 electrically connected to the third output module 143. In this case, the gate drive signal gout output by the first output module 140 of the i-th-stage shift register unit Gi is used as the input signal inf of the j-th-stage shift register unit Gj, so that the input signal inf of the j-th-stage shift register unit Gj may be kept to be consistent with the gate drive signal gout output by the first output module 140 of the i-th-stage shift register unit Gi. When the gate drive signal gout output by the first output module 140 of the i-th-stage shift register unit Gi is at the effective level, each output module 140 of the j-th-stage shift register unit Gj is controlled to output its output control signal out received by the j-th-stage shift register unit Gj as its gate drive signal output by the j-th-stage shift register unit Gj. In this case, it is only required to enable that the effective pulse time of the output control signal out received by each output module 140 in the j-th-stage shift register unit Gi is after the effective pulse time of the output control signal out received by each output module 140 in the i-th-stage shift register unit Gj, it can be ensured that the gate drive signal output by the i-th-stage shift register unit Gi and the gate drive signal output by the j-th-stage shift register unit Gj are sequentially shifted.

In other optional embodiments, the gate drive signal gout of the N-th output module 140 of the i-th-stage shift register unit Gi may also be used as the input signal inf of the j-th-stage shift register unit Gj. In this case, it is only required to ensure that an effective pulse time of the output control signal out received by each output module 140 of the j-th-stage shift register unit Gj is after in an effective pulse time of an N-th output control signal outN received by the N-th output module 140 of the i-th-stage shift register unit Gi, then the gate drive signal output by the i-th-stage shift register unit Gi and the gate drive signal output by the j-th-stage shift register unit Gj are ensured to be shifted sequentially.

Figure 17:
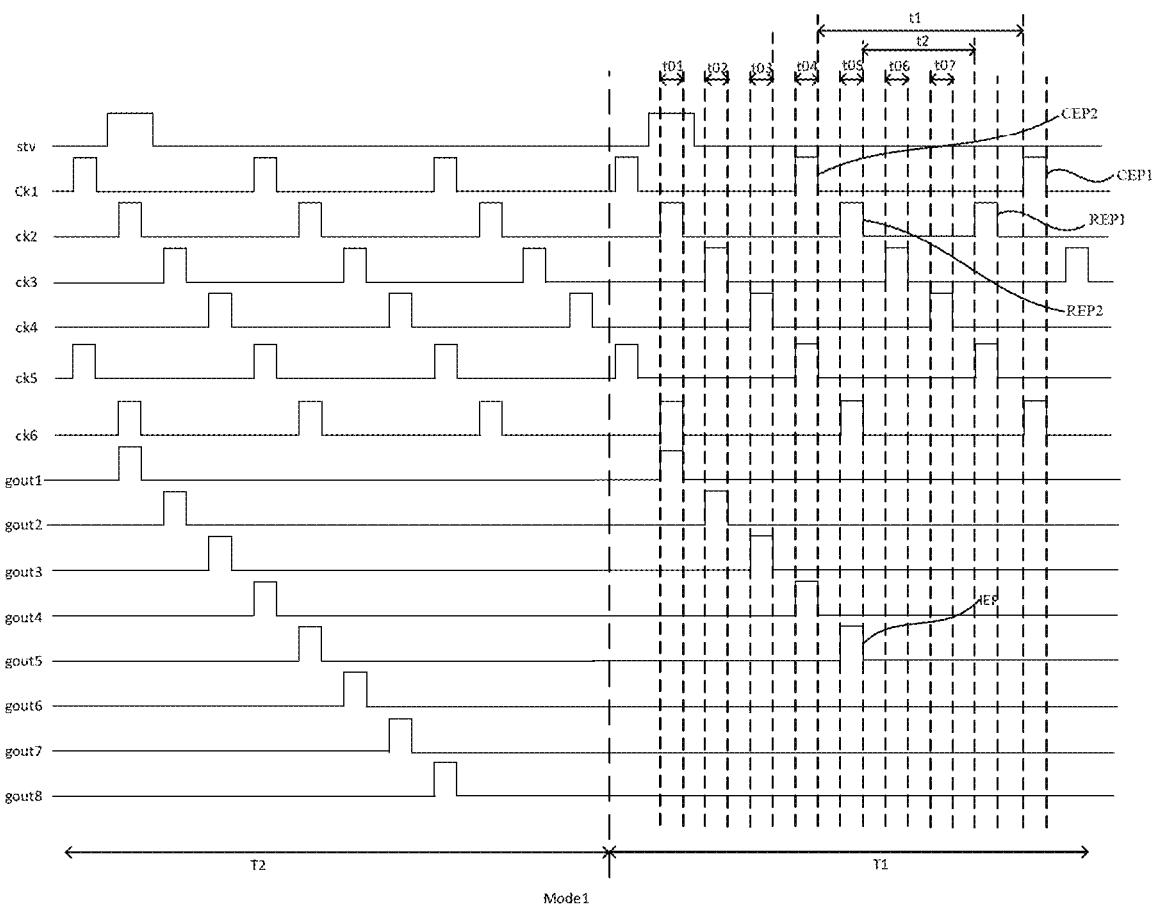
FIG. 17 is a drive timing diagram of still another shift register unit according to an embodiment of the present disclosure.

In an embodiment, FIG. 17 is a drive timing diagram of another driver circuit according to an embodiment of the present disclosure. With reference to FIG. 12, FIG. 14 and FIG. 17, or with reference to FIG. 3, FIG. 11 and FIG. 13, the reset clock signal of the j-th-stage shift register unit also serves as a first output control signal of the (j+1)-th-stage shift register unit.

In an embodiment, since the effective pulse time of the output control signal received by the (j+1)-th-stage shift register unit is after the effective pulse time of the output control signal received by the j-th-stage shift register unit, and the reset clock signal of the j-th-stage shift register unit is also after the effective pulse time of the output control signal received by the j-th-stage shift register unit, in this case, the reset clock signal of the j-th-stage shift register unit may also serve as the first output control signal of the (j+1)-th-stage shift register unit, so that the number of signals provided for the driver circuit and the number of signal lines providing clock signals for the driver circuit can be reduced on the premise of ensuring that each shift register unit normally outputs drive control signals, and thus the narrow frame design of the display panel is facilitated.

In an exemplary embodiment, with reference to FIG. 3, FIG. 11 and FIG. 13, when j=1, the reset clock signal rstf of the first-stage shift register unit G1 and the first output control signal out1 of the second-stage shift register unit G2 are each the clock signal ck4; when j=2, the reset clock signal rstf of the second-stage shift register unit G2 and the first output control signal out1 of the third-stage shift register unit G3 are each the clock signal ck2, and so on, so that a reset clock signal of a previous shift register unit may also serve as a first output control signal of a subsequent shift register unit.

In another exemplary embodiment, with reference to FIG. 12, FIG. 14 and FIG. 17, when j=1, the reset clock signal rstf of the first-stage shift register unit G1 and the first output control signal out1 of the second-stage shift register unit G2 are each the clock signal ck5; when j=2, the reset clock signal rstf of the second-stage shift register unit G2 and the first output control signal out1 of the third-stage shift register unit G3 are each the clock signal ck2, and so on, so that a reset clock signal of a previous shift register unit may also serve as a first output control signal of a subsequent shift register unit.

In an embodiment, with continued reference to FIG. 12, FIG. 14 and FIG. 17, or FIG. 3, FIG. 11 and FIG. 13, the reset clock signal rstf of the j-th-stage shift register unit G also serves as the reset clock signal rstf of a (j+2)-th-stage shift register unit Gj+2, and/or a k-th output control signal outk of the j-th-stage shift register unit Gj also serves as a k-th output control signal outk of the (j+2)-th-stage shift register unit Gj+2.

In an embodiment, since the output control signal is used for controlling the time at which the shift register unit G outputs the effective pulse of the gate drive signal, and effective pulse time of output control signals out received by the same shift register unit G is shifted sequentially, so that output modules in the same shift register unit G can sequentially output the effective pulses of the gate drive signal. In addition, in the adjacent two-stage shift register units G, the effective pulse time of the output control signal out received by the previous-stage shift register unit is before the effective pulse time of the output control signal out received by the subsequent-stage shift register unit, so that the effective pulse time of the gate drive signal output by the previous-stage shift register unit can be before the effective pulse time of the gate drive signal output by the subsequent-stage shift register unit. For example, the effective pulse time of the output control signal of the j-stage shift register unit G is before the effective pulse time of the output control signal of the (j+1)-stage shift register unit Gj+1, and the effective pulse time of the output control signal of the (j+1)-stage shift register unit Gj+1 is before the effective pulse time of the output control signal output by the (j+2)-stage shift register unit Gj+2. After the output modules of the j-th-stage shift register unit Gj output the effective pulses of the gate drive signals, the (j+1)-th-stage shift register unit Gj+1 starts to output the effective pulse of the gate drive signal. In this case, the first node N1 and the second node N2 of the j-th-stage shift register unit Gj may be reset, so that the j-th-stage shift register unit Gj starts to output the first level signal vgl as the gate drive signal. After output modules of the (j+1)-th-stage shift register unit Gj+1 output the effective pulses of the gate drive signals, the (j+2)-th-stage shift register unit Gj+2 starts to output the effective pulse of the gate drive signal. Since the first node N1 and the second node N2 of the j-th-stage shift register unit Gj are reset at this time, when the j-th-stage shift register unit Gj receives the effective pulse of the output control signal, the j-th-stage shift register unit Gj can still maintain the ineffective level of the output gate drive signal. In this way, the k-th output control signal outk of the j-th-stage shift register unit Gj may also serve as the k-th output control signal outk of the (j+2)-th-stage shift register unit Gj+2, to reduce the number of output control signals provided to the driver circuit and the number of signal lines that are set in the display panel and that are used for transmitting the output control signals, thereby simplifying the structure of the display panel and facilitating the narrow frame of the display panel.

Correspondingly, after the (j+2)-th-stage shift register unit Gj+2 outputs the effective pulse of the gate drive signal, the first node N1 and the second node N2 of the (j+2)-th-stage shift register unit Gj+2 may be reset. Since the reset of the first node N1 and the second node N2 in the j-th-stage shift register unit Gj is completed at this time, when the effective pulse of the reset clock signal retf of the j-th-stage shift register unit Gj comes again, the accuracy of the gate drive signal output by the j-th-stage shift register unit Gj is not affected. In this way, the reset clock signal rstf of the j-th-stage shift register unit Gj may also serve as the reset clock signal rstf of the (j+2)-th-stage shift register unit Gj+2, to reduce the number of signals provided to the driver circuit 10 and the number of signal lines providing clock signals to the driver circuit 10, while ensuring that each-stage shift register unit G normally outputs the drive control signals gout.

In an exemplary embodiment, with reference to FIG. 3, FIG. 11 and FIG. 13, when j=1, the reset clock signal rstf of the first-stage shift register unit G1 and the reset clock signal rstf of the third-stage shift register unit G3 are each the clock signal ck4, when j=2, the reset clock signal rstf of the second-stage shift register unit G2 and the reset clock signal rstf of the fourth-stage shift register unit G4 are each the clock signals ck2, and so on, so that the reset clock signal of the j-th-stage shift register unit may also serve as a reset clock signal of the (j+2)-th-stage shift register unit. Similarly, when j=1, the first output control signal out1 of the first-stage shift register unit G1 and the first output control signal out1 of the third-stage shift register unit G3 are each the clock signal ck2, and the second output control signal out2 of the first-stage shift register unit G1 and the second output control signal out2 of the third-stage shift register unit G3 are each the clock signal ck3; when j=2, the first output control signal out1 of the second-stage shift register unit G2 and the first output control signal out1 of the fourth-stage shift register unit G4 are each the clock signal ck4, and the second output control signal out2 of the second-stage shift register unit G2 and the second output control signal out2 of the fourth-stage shift register unit G4 are each the clock signal ck1, and so on, so that the k-th output control signal outk of the j-th-stage shift register unit Gj may also serve as the k-th output control signal outk of the (j+2)-th-stage shift register unit Gj+2.

In another exemplary embodiment, with reference to FIG. 12, FIG. 14 and FIG. 17, when j=1, the reset clock signal rstf of the first-stage shift register unit G1 and the reset clock signal rstf of the third-stage shift register unit G3 are each the clock signals ck5; when j=2, the reset clock signal rstf of the second-stage shift register unit G2 and the reset clock signal rstf of the fourth-stage shift register unit G4 are each the clock signal ck2, and so on, so that the reset clock signal of the j-th-stage shift register unit may also serve as the reset clock signal of the (j+2)-th-stage shift register unit. Similarly, when j=1, the first output control signal out1 of the first-stage shift register unit G1 and the first output control signal out1 of the third-stage shift register unit G3 are each the clock signal ck2, the second output control signal out2 of the first-stage shift register unit G1 and the second output control signal out2 of the third-stage shift register unit G3 are each the clock signal ck3, and the third output control signal out3 of the first-stage shift register unit G1 and the third output control signal out3 of the third-stage shift register unit G3 are each the clock signal ck4; when j=2, the first output control signal out1 of the second-stage shift register unit G2 and the first output control signal out1 of the fourth-stage shift register unit G4 are each the clock signal ck5, the second output control signal out2 of the second-stage shift register unit G2 and the second output control signal out2 of the fourth-stage shift register unit G4 are each the clock signal ck6, and the third output control signal out3 of the second-stage shift register unit G2 and the third output control signal out3 of the fourth-stage shift register unit G4 are each the clock signal ck1, and so on, so that the k-th output control signal outk of the j-th-stage shift register unit Gj may also serve as the k-th output control signal outk of the (j+2)-th-stage shift register unit Gj+2.

Figure 18:
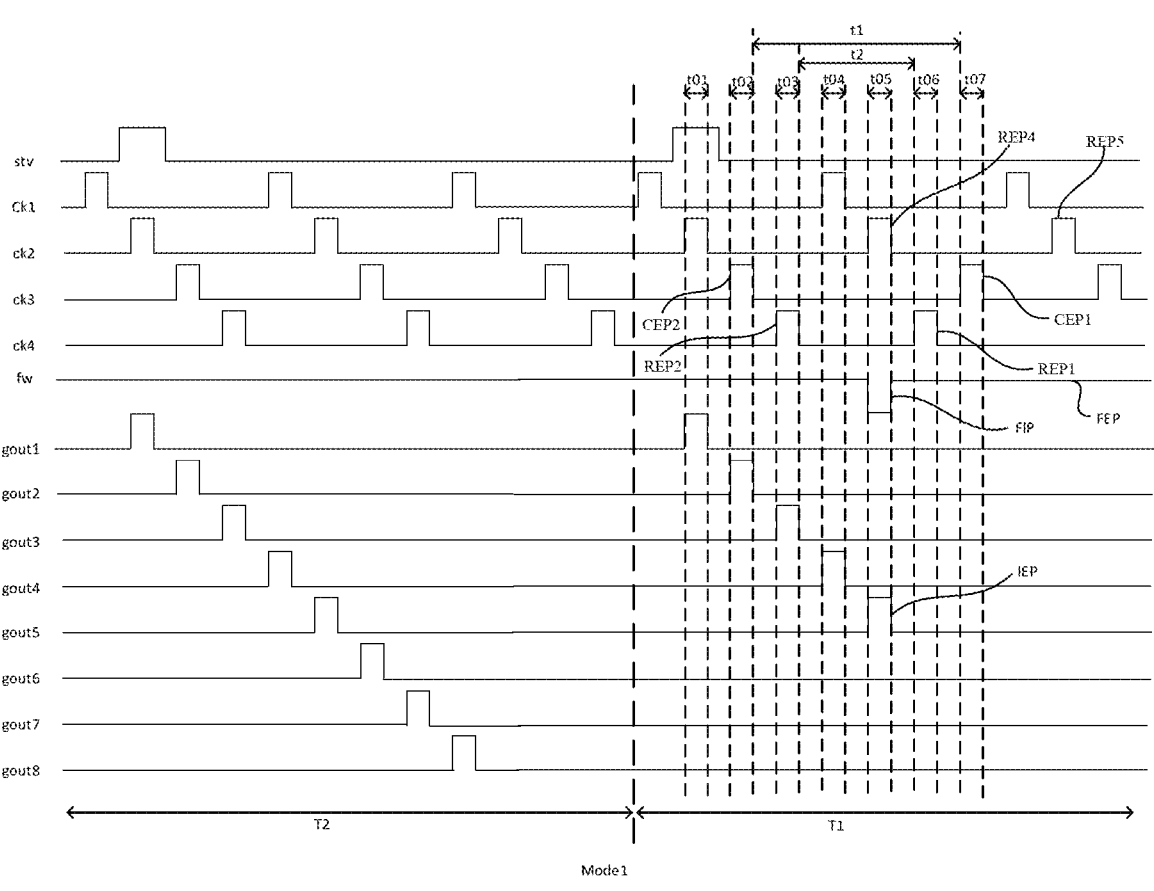
FIG. 18 is a drive timing diagram of still another driver circuit according to an embodiment of the present disclosure.

In an embodiment, FIG. 18 is a drive timing diagram of still another driver circuit according to an embodiment of the present disclosure. With reference to FIG. 2, FIG. 12 and FIG. 18, in the first display frame T1, the scan control signal fw received by the first shift register unit 11 includes one scan ineffective pulse.

In an embodiment, in order to further ensure that the gate drive signal gout output by the first shift register unit 11 is the ineffective level of the first-type output control signal out' or the first level signal vgl of the first-type output control signal out', the scan control signal fw received by the first shift register 11 may be set to include one scan ineffective pulse FIP, to ensure that a transistor that is in the output module 140 and that is used for transmitting the first-type output control signal out' keeps in the off state, thereby improving the accuracy of the gate drive signal gout output by the first shift register 11.

In an embodiment, with continued reference to FIG. 2, FIG. 12 and FIG. 18, in the first display frame T1, an input signal inf received by the first shift register unit 11 includes one input effective pulse IEP, and time of the input effective pulse IEP falls within time of the scan ineffective pulse FIP.

In an embodiment, in the first display frame T1, the time of the input effective pulse IEP (such as, the effective pulse of the fifth gate drive signal gout 5 in the drawings) is set to be fallen within the time of the scan ineffective pulse FIP of the scan control signal fw in the first shift register unit 11 (such as, the sixth-stage shift register unit G6 in the drawings), in this way, during the process that the input signal inf controls the input module 110 to be on, the scan ineffective pulse FIP of the scan control signal fw may be transmitted to the first node N1 through the input module 110 in the on state, so that the signal at the first node N1 of the first shift register unit 11 always remains at the low level, it is further ensured that the output module 140 is maintained in the off state during a process that the first-type output control signal out' is the effective pulse, to ensure that the gate drive signal gout outputted by the first shift register unit 11 is the ineffective level of the first-type output control signal out' or the first level signal vgl.

In an embodiment, with reference to FIG. 1 and FIG. 18, the multiple stages of shift register units G receive the same scan control signal fw. In the first display frame T1, the scan control signal fw further includes a scan effective level FEP that is after the scan ineffective pulse FIP. In the first mode Mode1, the driver circuit 10 further includes a second shift register unit 12. In the first display frame T1 and in the second shift register unit 12, effective pulses of the reset clock signal rstf includes two adjacent effective pulses that are separately a fourth reset effective pulse REP4 and a fifth reset effective pulse REP5. The fourth reset effective pulse REP4 overlaps with the scan ineffective pulse FIP. The fifth reset effective pulse REP5 overlaps with the scan effective level FEP.

In an embodiment, in the first mode Mode1, the driver circuit 10 further includes a second shift register unit 12 that normally outputs the effective pulse of the gate drive signal gout. After the second shift register unit 12 outputs the effective level of the gate drive signal, the first node N1 and the second node N2 of the second shift register unit 12 are reset through the reset clock signal received by the second shift register unit 12, so that the second node N2 becomes at the effective level and the first node N1 becomes at the ineffective level. In the first display frame T1, the scan control signal fw is set to include a scan ineffective pulse FIP, so that a signal of the first node N1 of the first shift register unit 11 may be kept at the ineffective level. If the scan control signal fw is the scan ineffective pulse FIP, the reset clock signal rstf of the second shift register unit 12 is the fourth reset effective pulse REP4, so that the fourth reset effective pulse REP4 cannot be written to the second shift register unit 12, and the second shift register unit 12 cannot be reset in the time period. In this case, after the scan control signal fw becomes the effective level, the reset clock signal rstf of the second shift register unit 12 is set to the fifth reset active pulse REP5, so that the fifth reset effective pulse REP5 may be written into the second shift register unit 12 to reset the first node N1 and the second node N2 of the second shift register unit 12 and avoid the fact that the accuracy of the gate drive signal gout output by the second shift register unit 12 is affected due to the signal of the first node N1 and the signal of the second node N2 being unable to be effectively reset.

Figure 19:
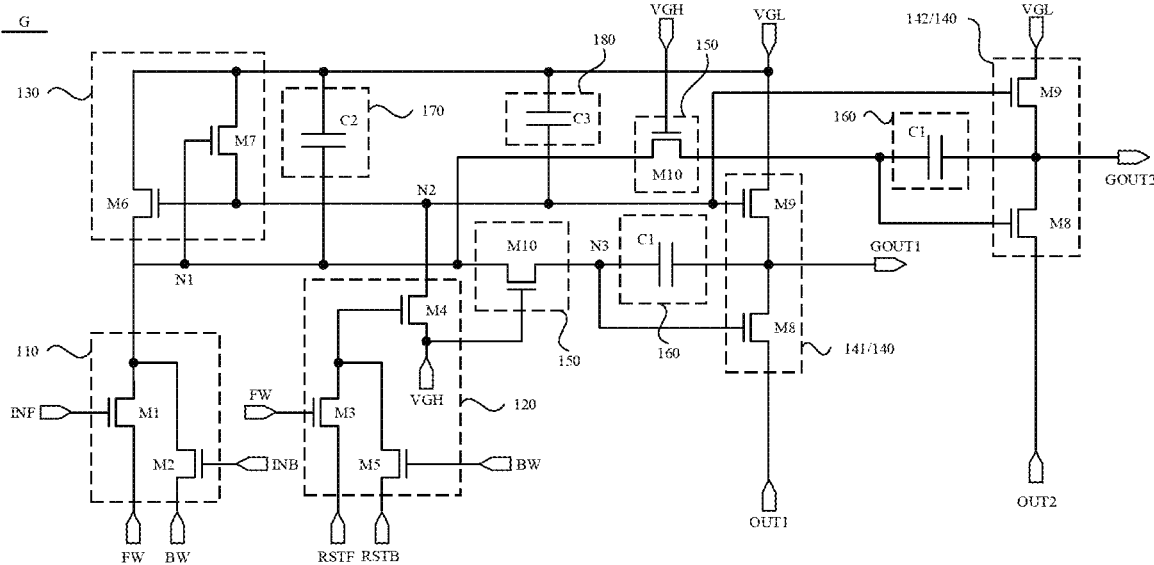
FIG. 19 is a schematic structural diagram of still another shift register unit according to an embodiment of the present disclosure.

In an embodiment, FIG. 19 is a schematic structural diagram of still another shift register unit according to an embodiment of the present disclosure. Referring to FIG. 19, when the shift register unit G includes multiple output modules 140, the shift register unit G may include voltage regulation modules 150 disposed in one-to-one correspondence with the output modules 140 and bootstrap modules 160 disposed in one-to-one correspondence with the output modules 140, to implement the stability control on the gate drive signals gout output by the output modules 140.

Figure 20:
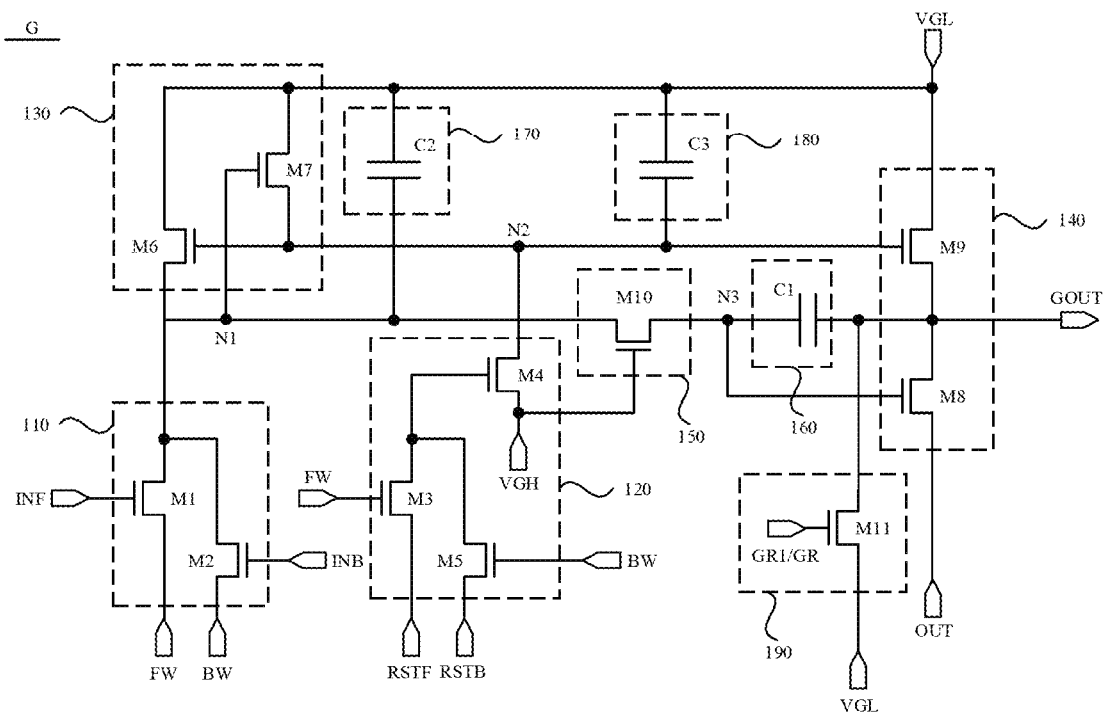
FIG. 20 is a schematic structural diagram of still another shift register unit according to an embodiment of the present disclosure.
Figure 21:
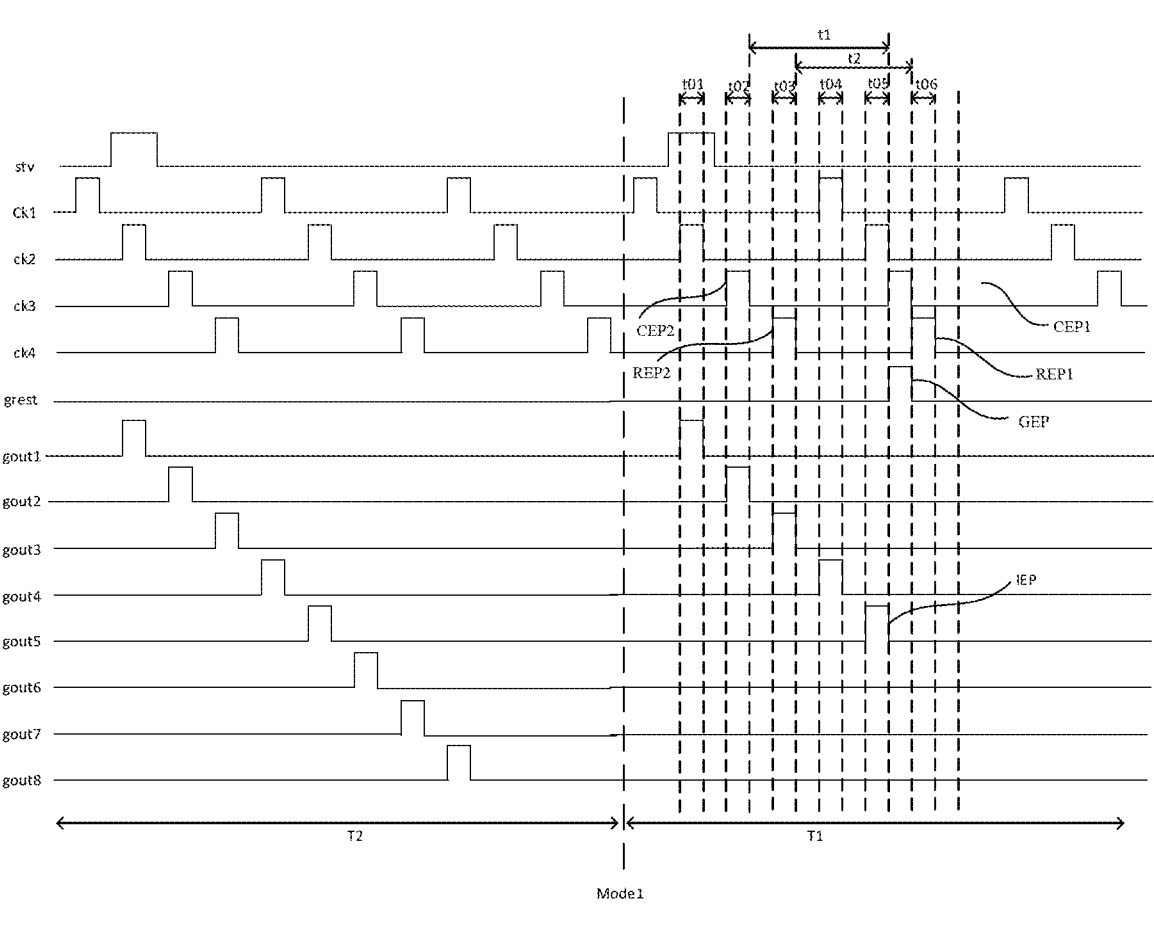
FIG. 21 is a drive timing diagram of still another driver circuit according to an embodiment of the present disclosure.

On the basis of the above-described embodiments, in an embodiment, FIG. 20 is a schematic structural diagram of still another shift register unit according to an embodiment of the present disclosure, and FIG. 21 is a drive timing diagram of still another driver circuit according to an embodiment of the present disclosure. With reference to FIG. 20 and FIG. 21, the shift register unit G further includes a setting module 190. The setting module 190 is configured to receive at least a setting signal grest and the first level signal vgl and control the first level signal vgl to serve as the gate drive signal gout when the setting signal GAS is at the effective level. In the first display frame T1, the setting signal grest includes at least one setting effective pulse GEP, and the input signal inf received by the first shift register unit 11 includes one input effective pulse IEP. The time of the at least one setting effective pulse GEP is after the time of the input effective pulse IEP.

In an embodiment, the setting module 190 is set to be electrically connected to the setting signal terminal GR and the first level signal terminal VGL, to receive the grest provided by the setting signal terminal GR and the first level signal vgl provided by the first level signal terminal VGL. In the first display frame T1, after a time of the setting effective pulse GEP of the setting signal grest is set to be after the input effective pulse IEP of the input signal inf received by the first shift register unit 11, so that after the first shift register unit 11 receives the input effective pulse IEP of the input signal inf, the first node N1 is controlled to be at the low level through the setting effective pulse GEP of the setting signal grest, thereby it is further ensured that the first-type output control signal out' received by the first shift register unit 11 is at the effective pulse, the output module 140 of the first shift register unit 11 may be controlled to continuously output the ineffective level of the gate drive signal, thereby further ensuring that the first shift register unit 11 and other stages of shift register units gout after the first shift register unit 11 output the ineffective level of the gate drive signal gout, and thus making two sub-display regions of the display panel 100 have different refresh frequencies.

The setting module 190 may include a setting transistor M11. A gate of the setting transistor M11 is electrically connected to the setting signal terminal GR to receive the setting signal grest. A first electrode of the setting transistor M11 is electrically connected to the first level signal terminal VGL to receive the first level signal vgl. A second electrode of the setting transistor M11 is electrically connected to the gate drive signal terminal GOUT. When the setting signal grest is at the effective pulse, the setting transistor M11 is on, and the first level signal vgl is transmitted to the gate drive signal terminal GOUT.

It is to be understood that when the shift register unit includes multiple output modules, the setting modules electrically connected to the output modules may be the same setting module, or may be different setting modules, which are not specifically limited in the embodiments of the present disclosure.

Figure 22:
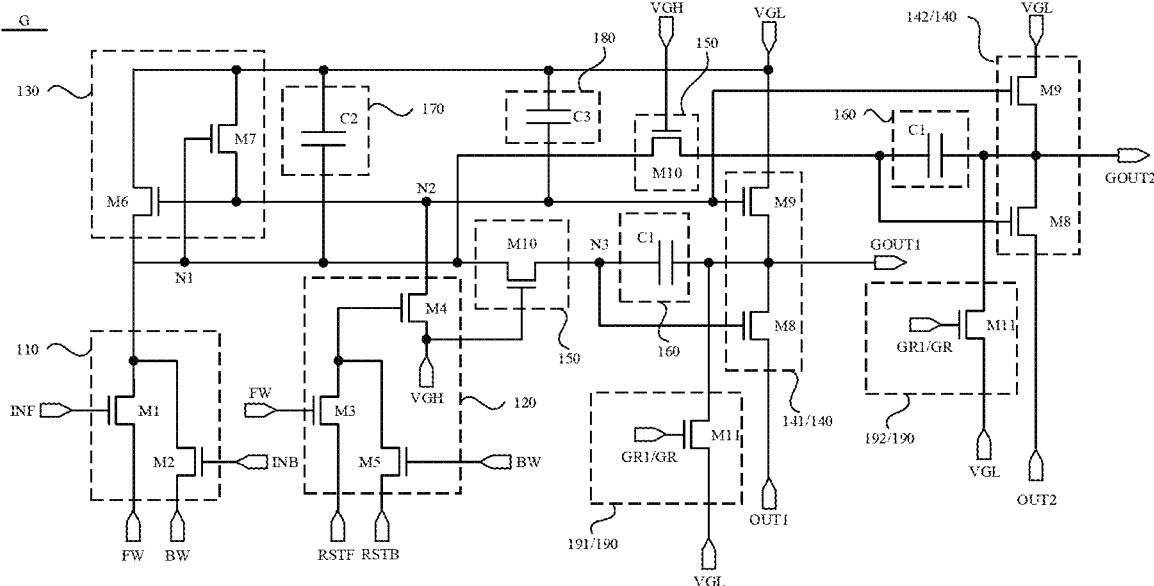
FIG. 22 is a schematic structural diagram of still another shift register unit according to an embodiment of the present disclosure.

In some embodiments, FIG. 22 is a schematic structural diagram of still another shift register unit according to an embodiment of the present disclosure. As shown in FIG. 22, when N≥2, the shift register unit G may include setting modules 190, and the setting modules 190 are disposed in one-to-one correspondence with the output modules 140. For example, a first setting module 191 is electrically connected to the first gate drive signal terminal GOUT1, and a second set module 192 is electrically connected to the second gate drive signal terminal GOUT2, and in this way, the setting modules may clear the signals of the first nodes N1 received by the output modules 140, separately.

Based on a same invention concept, embodiments of the present disclosure further provide a display device. The display device includes the display panel provided in the embodiments of the present disclosure. Therefore, the display device has technical features of the display panel and the driving method of the display panel provided in the embodiments of the present disclosure, so that beneficial effects of the display panel provided in the embodiments of the present disclosure can be achieved. For the same points, reference may be made to the description of the display panel provided in the embodiments of the present disclosure, and the details are not repeated herein.

Figure 23:
FIG. 23 is a schematic structural diagram of a display device according to an embodiment of the present disclosure.

In some embodiments, FIG. 23 is a schematic structural diagram of a display device according to an embodiment of the present disclosure. As shown in FIG. 23, the display device 200 includes the display panel 100 provided in the embodiments of the present disclosure. The display device 200 provided in the embodiments of the present disclosure may be any electronic product that has the display function, and the any electronic product includes, but is not limited to, a mobile phone, a television set, a notebook computer, a desktop display, a tablet computer, a digital camera, a smart band, smart glasses, an in-vehicle display, a medical device, an industrial control device, a touch interaction terminal and the like, which is not specifically limited in the embodiments of the present disclosure.

The above implementations should not be construed as limiting the scope of protection of the present disclosure. It should be understood by those skilled in the art that various modifications, combinations, sub-combinations and substitutions may be made according to the design requirements and other factors. Any modification, equivalent replacement, and improvement made within the spirit and principle of the present disclosure should be included within the scope of protection of the present disclosure.

What is claimed is:

1. A display panel, comprising a driver circuit, wherein the driver circuit comprises a plurality of cascaded shift register units; wherein a shift register unit of the plurality of cascaded shift register units comprises an input module, a reset module, a node mutual control module, and N output modules, wherein N is a positive integer;

in a same shift register unit among the plurality of cascaded shift register units, the input module is configured to receive at least an input signal and a scan control signal and control a signal of a first node; the reset module is configured to receive at least a reset clock signal and the scan control signal and control a signal of a second node; the node mutual control module is configured to receive at least the signal of the first node and the signal of the second node, control the signal of the second node according to the signal of the first node, and control the signal of the first node according to the signal of the second node; and an output module of the N output modules is configured to receive at least the signal of the first node, the signal of the second node, a first level signal and an output control signal and control a gate drive signal;

at least one gate drive signal of an i-th-stage shift register unit among the plurality of cascaded shift register units is an input signal of a j-th-stage shift register unit among the plurality of cascaded shift register units, wherein i≠j, and i and j are each a positive integer;

in each display frame of the display panel, each of the reset clock signal and the output control signal comprises a plurality of effective pulses; and a working mode of the display panel comprises a first mode; the first mode comprises at least one first display frame, and the driver circuit comprises a first shift register unit; in the first display frame, each of at least part of the output control signal received by the first shift register unit is a first-type output control signal; in the first shift register unit, a time interval between two adjacent effective pulses of the first-type output control signal is a first time interval, and a time interval between two adjacent effective pulses of the reset clock signal is a second time interval; and during a display stage of the first display frame, the second time interval falls within the first time interval, and the first time interval is greater than the second time interval;

wherein in the first display frame and in the first shift register unit, an input signal comprises an effective pulse, the reset clock signal comprises one first reset effective pulse, and the first-type output control signal comprises one first output effective pulse;

in the effective pulses of the reset clock signal, a first effective pulse after the effective pulse of the input signal is the first reset effective pulse;

in effective pulses of the first-type output control signal, a first effective pulse after the effective pulse of the input signal is the first output effective pulse; and time of the first reset effective pulse is before time of the first output effective pulse.

2. The display panel of claim 1, wherein in the first display frame, a reset clock signal of the first shift register unit further comprises one second reset effective pulse; time of the second reset effective pulse is before the time of the first reset effective pulse, and the first reset effective pulse and the second reset effective pulse are two adjacent effective pulses; and a time interval between the first reset effective pulse and the second reset effective pulse is the second time interval;

in the first display frame, the first-type output control signal of the first shift register unit further comprises one second output effective pulse; and time of the second output effective pulse is before the time of the first output effective pulse, and the first output effective pulse and the second output effective pulse are two adjacent effective pulses; and a time interval between the first output effective pulse and the second output effective pulse is the first time interval; and the time of the second output effective pulse is before the time of the second reset effective pulse.

3. The display panel of claim 2, wherein in the first display frame and in the first shift register unit, the reset clock signal further comprises at least one third reset effective pulse before the second reset effective pulse, and the first-type output control signal further comprises at least one third output effective pulse before the second output effective pulse;

in the first-type output control signal, a time interval between the second output effective pulse and a third output effective pulse adjacent to the second output effective pulse is a third time interval;

in the reset clock signal, a time interval between the second reset effective pulse and a third reset effective pulse adjacent to the second reset effective pulse is a fourth time interval; and the third time interval is equal to the fourth time interval.

4. The display panel of claim 3, wherein the first time interval is greater than the third time interval, and the second time interval is less than the fourth time interval.

5. The display panel of claim 3, wherein the first time interval is equal to the third time interval, and the second time interval is less than the fourth time interval.

6. The display panel of claim 3, wherein the first time interval is greater than the third time interval, and the second time interval is equal to the fourth time interval.

7. The display panel of claim 1, wherein in a case where N is greater than or equal to 2, in a same shift register unit among the plurality of cascaded shift register units, the N output modules receive different output control signals respectively, and effective pulse time of output control signals received by the plurality of cascaded shift register units is shifted sequentially.

8. The display panel of claim 7, wherein in a same shift register unit among the plurality of cascaded shift register units, an output control signal received by a k-th output module is a k-th output control signal, and effective pulse time of the k-th output control signal is before effective pulse time of a (k+1)-th output control signal, wherein k is a positive integer, and k is less than N; and a gate drive signal output by a first output module of the i-th-stage shift register unit or an N-th output module of the i-th-stage shift register unit is the input signal received by the input module of the j-th-stage shift register unit.

9. The display panel of claim 8, wherein a reset clock signal of the j-th-stage shift register unit also serves as a first output control signal of a (j+1)-th-stage shift register unit among the plurality of cascaded shift register units.

10. The display panel of claim 8, wherein at least one of following is satisfied:

a reset clock signal of the j-th-stage shift register unit also serves as a reset clock signal of a (j+2)-th-stage shift register unit; or a k-th output control signal of the j-th-stage shift register unit also serves as a k-th output control signal of a (j+2)-th-stage shift register unit.

11. The display panel of claim 1, wherein in a case where N is equal to 1, at least one of following is satisfied:

a gate drive signal of the j-th-stage shift register unit is an input signal of a (j+1)-th-stage shift register unit, wherein j is a positive integer, a reset clock signal of the j-th-stage shift register unit also serves as a reset clock signal of a (j+4)-th-stage shift register unit; or an output control signal of the j-th-stage shift register unit also serves as an output control signal of a (j+4)-th-stage shift register unit.

12. The display panel of claim 1, wherein in the first display frame, the scan control signal received by the first shift register unit comprises one scan ineffective pulse.

13. The display panel of claim 12, wherein in the first display frame, an input signal received by the first shift register unit comprises one input effective pulse, and time of the input effective pulse falls within time of the scan ineffective pulse.

14. The display panel of claim 12, wherein the plurality of cascaded shift register units receive a same scan control signal; and in the first display frame, the scan control signal further comprises a scan effective level that is after the scan ineffective pulse; and in the first mode, the driver circuit further comprises a second shift register unit; in the first display frame and in the second shift register unit, each effective pulse of the reset clock signal comprises two adjacent effective pulses that are separately a fourth reset effective pulse and a fifth reset effective pulse; and the fourth reset effective pulse overlaps with the scan ineffective pulse; and the fifth reset effective pulse overlaps with the scan effective pulse.

15. The display panel of claim 1, wherein the shift register unit further comprises a setting module;

the setting module is configured to receive at least a setting signal and the first level signal, and control the first level signal to serve as the gate drive signal when the setting signal is at an effective level; and in the first display frame, the setting signal comprises at least one setting effective pulse, and an input signal received by the first shift register unit comprises one input effective pulse;

and time of the at least one setting effective pulse is after time of the input effective pulse.

16. The display panel of claim 1, comprising a display region, wherein a plurality of gate drive lines are disposed in the display region, and each-stage shift register unit among the plurality of cascaded shift register units is electrically connected to a respective gate drive line of the plurality of gate drive lines;

in the first mode, the display region comprises a first sub-display region and a second sub- display region; and in the first display frame, gate drive lines located in the first sub-display region are first gate drive lines, and gate drive lines located in the second sub-display region are second gate drive lines; and effective pulse time of gate drive signals transmitted by the first gate drive lines is shifted sequentially, and gate drive signals transmitted by the second gate drive lines are at an ineffective level.

17. The display panel of claim 1, wherein the display panel further comprises a second mode; and in one display frame in the second mode, in a same shift register unit among the plurality of cascaded shift register units, a time interval between two adjacent effective pulses of the output control signal is equal to the time interval between the two adjacent effective pulses of the reset clock signal.

18. The display panel of claim 1, wherein the node mutual control module comprises a first mutual control transistor and a second mutual control transistor; wherein in a same shift register unit among the plurality of cascaded shift register units, a gate of the first mutual control transistor is electrically connected to the second node, a first electrode of the first mutual control transistor is configured to receive the first level signal, and a second electrode of the first mutual control transistor is electrically connected to the first node; and a gate of the second mutual control transistor is electrically connected to the first node, a first electrode of the second mutual control transistor is configured to receive the first level signal, and a second electrode of the second mutual control transistor is electrically connected to the second node.

19. A display device, comprising a display panel, wherein the display panel comprises a driver circuit, wherein the driver circuit comprises a plurality of cascaded shift register units; wherein a shift register unit of the plurality of cascaded shift register units comprises an input module, a reset module, a node mutual control module, and N output modules, wherein N is a positive integer;

in a same shift register unit among the plurality of cascaded shift register units, the input module is configured to receive at least an input signal and a scan control signal and control a signal of a first node; the reset module is configured to receive at least a reset clock signal and the scan control signal and control a signal of a second node; the node mutual control module is configured to receive at least the signal of the first node and the signal of the second node, control the signal of the second node according to the signal of the first node, and control the signal of the first node according to the signal of the second node; and an output module of the N output modules is configured to receive at least the signal of the first node, the signal of the second node, a first level signal and an output control signal and control a gate drive signal;

at least one gate drive signal of an i-th-stage shift register unit among the plurality of cascaded shift register units is an input signal of a j-th-stage shift register unit among the plurality of cascaded shift register units, wherein i≠j, and i and j are each a positive integer;

in each display frame of the display panel, each of the reset clock signal and the output control signal comprises a plurality of effective pulses; and a working mode of the display panel comprises a first mode; the first mode comprises at least one first display frame, and the driver circuit comprises a first shift register unit; in the first display frame, each of at least part of the output control signal received by the first shift register unit is a first-type output control signal; in the first shift register unit, a time interval between two adjacent effective pulses of the first-type output control signal is a first time interval, and a time interval between two adjacent effective pulses of the reset clock signal is a second time interval; and during a display stage of the first display frame, the second time interval falls within the first time interval, and the first time interval is greater than the second time interval;

wherein in the first display frame and in the first shift register unit, an input signal comprises an effective pulse, the reset clock signal comprises one first reset effective pulse, and the first-type output control signal comprises one first output effective pulse;

in the effective pulses of the reset clock signal, a first effective pulse after the effective pulse of the input signal is the first reset effective pulse;

in effective pulses of the first-type output control signal, a first effective pulse after the effective pulse of the input signal is the first output effective pulse; and time of the first reset effective pulse is before time of the first output effective pulse.

* * * * *